(12) United States Patent
Tümer et al.

(10) Patent No.: US 7,634,061 B1
(45) Date of Patent: Dec. 15, 2009

(54) HIGH RESOLUTION IMAGING SYSTEM

(75) Inventors: Tümay O. Tümer, Riverside, CA (US); Martin Clajus, Riverside, CA (US)

(73) Assignee: Nova R & D, Inc., Riverside, CA (US)

(*) Notice: Subject to any disclaimer, the term of this patent is extended or adjusted under 35 U.S.C. 154(b) by 0 days.

(21) Appl. No.: 11/090,123

(22) Filed: Mar. 28, 2005

Related U.S. Application Data

(60) Provisional application No. 60/556,507, filed on Mar. 26, 2004.

(51) Int. Cl.
  *G01N 23/087* (2006.01)
  *H05G 1/64* (2006.01)

(52) U.S. Cl. .................. 378/98.9; 378/62; 378/98.8

(58) Field of Classification Search .......... 378/62, 378/98.8, 98.9
  See application file for complete search history.

(56) References Cited

U.S. PATENT DOCUMENTS

| | | | | |
|---|---|---|---|---|
| RE32,164 | E * | 5/1986 | Kruger | 378/19 |
| 4,937,453 | A * | 6/1990 | Nelson | 250/370.09 |
| 4,948,977 | A * | 8/1990 | Mulder | 250/370.09 |
| 4,950,906 | A * | 8/1990 | Beerlage | 250/370.08 |
| 5,040,199 | A * | 8/1991 | Stein | 378/56 |
| 5,336,879 | A * | 8/1994 | Sauer | 250/208.1 |
| 5,352,897 | A * | 10/1994 | Horikawa et al. | 250/370.06 |
| 5,570,403 | A * | 10/1996 | Yamazaki et al. | 378/5 |
| 5,917,881 | A * | 6/1999 | Jeffery | 378/98.8 |
| 6,049,584 | A * | 4/2000 | Pfeiffer | 378/39 |
| 6,438,201 | B1 * | 8/2002 | Mazess et al. | 378/56 |
| 6,496,557 | B2 * | 12/2002 | Wilson et al. | 378/21 |
| 7,223,981 | B1 * | 5/2007 | Capote et al. | 250/370.13 |
| 2004/0144927 | A1 * | 7/2004 | Auner et al. | 250/370.11 |

OTHER PUBLICATIONS

Tümer, Tümay O. et al., "High-resolution pixel detectors for second generation digital mammography", *Nuclear Instruments and Methods in Physics Research*, 2003, pp. 21-29, vol. 497 A known good reference.

Lewin, John M. et al., "Clinical Comparison of Full-field Digital Mammography and Screen-film Mammography for Detection of Breast Cancer," *American Journal of Roentgenol*, Sep. 2002, pp. 671-677, vol. 179.

(Continued)

*Primary Examiner*—Chih-Cheng G Kao
*Assistant Examiner*—Thomas R Artman
(74) *Attorney, Agent, or Firm*—Fish & Associates, PC

(57) ABSTRACT

New sensors, pixel detectors and different embodiments of multi-channel integrated circuit are disclosed. The new high energy and spatial resolution sensors use solid state detectors. Each channel or pixel of the readout chip employs low noise preamplifier at its input followed by other circuitry. The different embodiments of the sensors, detectors and the integrated circuit are designed to produce high energy and/or spatial resolution two-dimensional and three-dimensional imaging for different applications. Some of these applications may require fast data acquisition, some others may need ultra high energy resolution, and a separate portion may require very high contrast. The embodiments described herein addresses these issues and also other issues that may be useful in two and three dimensional medical and industrial imaging. The applications of the new sensors, detectors and integrated circuits addresses a broad range of applications such as medical and industrial imaging, NDE and NDI, security, baggage scanning, astrophysics, nuclear physics and medicine.

58 Claims, 14 Drawing Sheets

OTHER PUBLICATIONS

Tümer, Tümay O. et al., "New ASICs Specifically Developed for Position Sensitive Solid State Detectors," Presented at the 10th Symposium of Radiation Measurements and Applications at the University of Michigan, May 2002.

Yin, Shin et al., "Direct Conversion CdZnTe and CdTe Detectors for Digital Mammography," *IEEE Transactions on Nuclear Science*, Feb. 2002, pp. 176-181, vol. 49, No. 1.

Yin, Shin et al., "Direct conversion Si and CdZnTe detectors for digital mammography," *Nuclear Instruments and Methods in Physics Research*, 2000, pp. 591-597, vol. 448 A known good reference.

Yin, Shin et al., "Hybrid Direct Conversion Detectors for Digital Mammography," Presented at IEEE Nuclear Sicence Symposium in 1998, Published Dec. 1999.

Mainprize, James G. et al., "Image Quality of a Prototype Direct Conversion Detector for Digital Mammography,"Published in Society of Photo-Optical Instrumentation Engineers Medical Imaging Conference Proceeding, 1999 p. 118 A known good reference.

Yin, Shin et al., "A Low-Dose High Contrast Digital Mammography System (DigiMAM)," Presented at IEEE Meeting, Toronto Canada, Nov. 1998.

Mainprize, James G. et al., "Design Considerations for a CdZnTe Digital Mammography System," Presented at the International Workshop on Digital Mammography, Nijmegen, Netherlands, Jun. 1998.

Yaffe, M.J. et al., "X-ray detectors for digital radiography," *Phys. Med. Biol.*, 1997, pp. 1-39, vol. 42. A known good reference.

Asaga, Taroh et al., "Dual-Energy Subtraction Mammography," *Journal of Digital Imaging*, Feb. 1996, pp. 70-73, vol. 1, No. 1, Suppl. 1.

\* cited by examiner

HIGH RESOLUTION IMAGING SYSTEM

CROSS-REFERENCE TO RELATED APPLICATION

This application claims the benefit of U.S. Provisional Application Serial Number No. 60/556,507 filed on Mar. 26, 2004, entitled HIGH RESOLUTION IMAGING SYSTEM. The afore-mentioned application is hereby incorporated by reference herein in its entirety, including but not limited to those portions that specifically appear hereinafter, the incorporation by reference being made with the following exception: In the event that any portion of the above-referenced application is inconsistent with this application, this application supercedes said above-referenced applications.

STATEMENT REGARDING FEDERALLY SPONSORED RESEARCH OR DEVELOPMENT

Some parts of the invention were made with U.S. Government support under Contract Numbers DAAE 30-02-C-1015, DAAE 30-03-C-1074, and DAMD 17-01-1-0356, which are awarded by the Department of Defense. The U.S. Government has certain rights on parts of the invention.

BACKGROUND OF THE INVENTION

1. The Field of the Disclosure

The present disclosure relates generally to radiographic imaging, and more particularly, but not necessarily entirely, to diagnostic x-ray imaging.

2. Description of Related Art

Radiographic imaging systems are well known in the art and in particular scanning radiographic systems are known in the art. It is further known that CdZnTe or other solid state radiation detectors can be used to detect x-rays. The prior art teaches various other features that may be incorporated into a scanning radiographic system. However, use of a scanning system coupled to the disclosed position sensitive digital detection methods are not.

The features and advantages of the disclosure will be set forth in the description which follows, and in part will be apparent from the description, or may be learned by the practice of the disclosure without undue experimentation. The features and advantages of the disclosure may be realized and obtained by means of the apparatus and combinations particularly pointed out in the appended claims.

BRIEF DESCRIPTION OF THE INVENTION

The disclosed fast full body digital radiography system is a direct imaging digital radiography system and will not use radiographic film. The solid state pixel detectors have high MTF, about 5 to 8 line pairs per mm, approaching the resolution of a screen-film system. The system has high DQE, about 50%-70%, and high contrast, therefore low dose to the patient. The linear array has a low projected area for x-rays scattered in the patient's body and therefore low background and higher signal to noise ratio. The images are taken in scanning mode using the Time Delayed Integration (TDI) technique. This technique produces uniform images without flawed or dead image pixels even if there are a moderate number of random defective detector pixels.

This is a low cost, digital (no film), high resolution, low dose and fast general whole or partial body radiography system that will allow immediate and fast prescreening of patients arriving at emergency rooms (ER). In human diagnostic applications the system is capable of screening a whole body or parts of a body in several seconds and displaying the image in real time on a high resolution computer screen without the need for accurate patient positioning and elaborate exposure setting. Small and portable machines can be used in ambulances, special imaging vans, rural and remote communities, during catastrophic events, on battlefields and in field hospitals.

The high resolution imaging detectors described below can be used for other applications, including security scanning for explosives and contraband at airports and other installations, computed tomography (CT) scanners for medicine, digital radiography such as digital mammography, and industrial non destructive inspection (NDI) and analysis (NDA) can be performed.

BRIEF DESCRIPTION OF THE DRAWINGS

The features and advantages of the disclosure will become apparent from a consideration of the subsequent detailed description presented in connection with the accompanying drawings in which.

DETAILED DESCRIPTION

Figure 1:
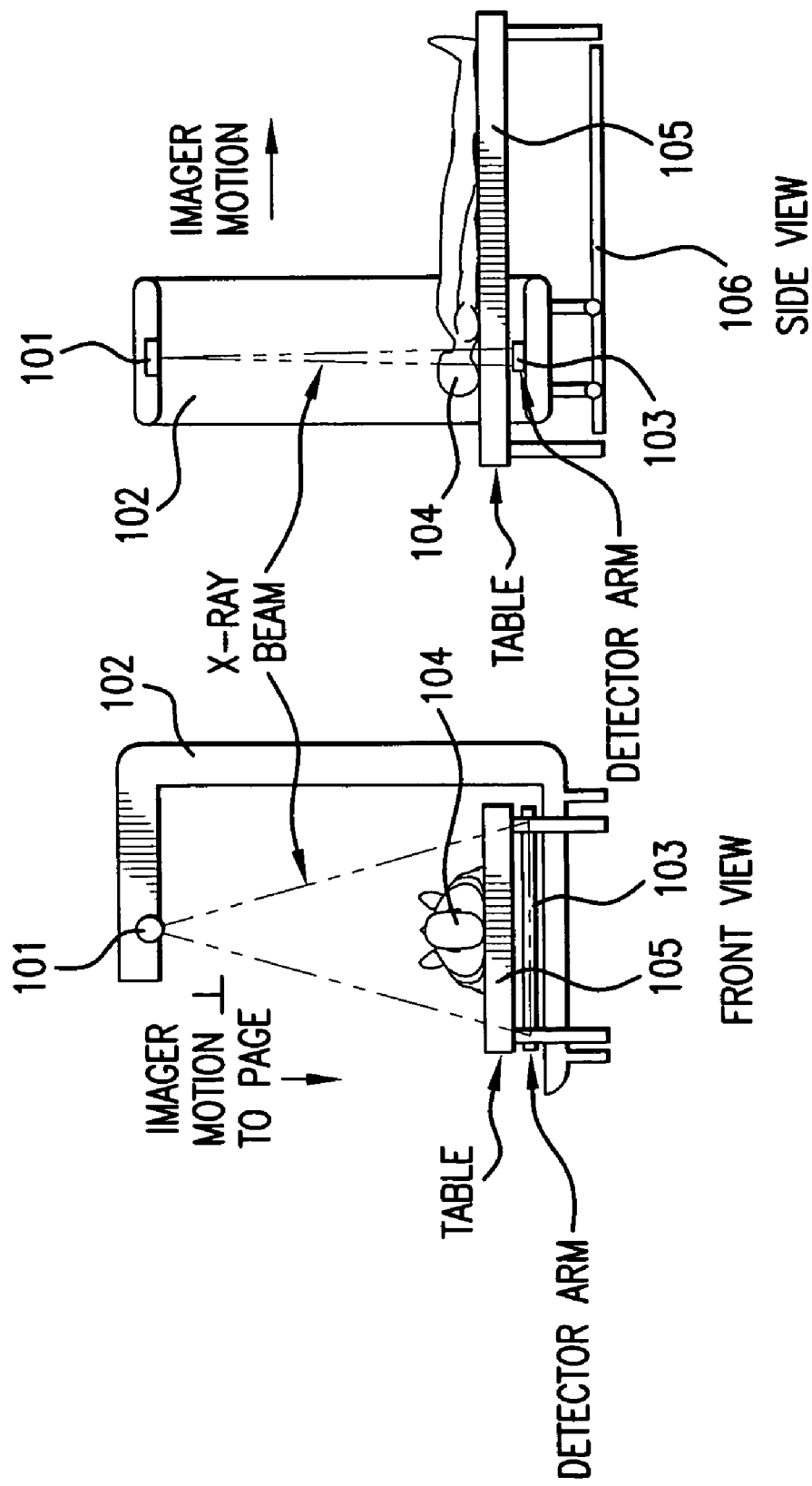
FIG. 1 is a drawing of the disclosed whole body fast digital radiography scanning system.

For the purposes of promoting an understanding of the principles in accordance with the disclosure, reference will now be made to the embodiments illustrated in the drawings and specific language will be used to describe the same. It will nevertheless be understood that no limitation of the scope of the disclosure is thereby intended. Any alterations and further modifications of the inventive features illustrated herein, and any additional applications of the principles of the disclosure as illustrated herein, which would normally occur to one skilled in the relevant art and having possession of this disclosure, are to be considered within the scope of the disclosure claimed. It is also noted that the prior provisional application contains more detailed disclosure of the invention, which can be referenced.

The publications and other reference materials referred to herein to describe the background of the disclosure, and to provide additional detail regarding its practice, are hereby incorporated by reference herein in their entireties, with the following exception: In the event that any portion of said reference materials is inconsistent with this application, this application supercedes said reference materials. The reference materials discussed herein are provided solely for their disclosure prior to the filing date of the present application. Nothing herein is to be construed as a suggestion or admission that the inventors are not entitled to antedate such disclosure by virtue of prior disclosure, or to distinguish the present disclosure from the subject matter disclosed in the reference materials.

The following publications are hereby incorporated by reference herein in their entireties: Shi Yin, Tümay O. Tümer, Dale Maeding, James Mainprize, Gord Mawdsley, Martin Yaffe and William J. Hamilton "A Low-Dose High Contrast Digital Mammography System (DigiMAM)", Presented in IEEE Medical Imaging Conference and Submitted to IEEE Trans. Nucl Science (November 1998); J. G. Mainprize, N. Ford, S. Yin, T. O. Tümer, M. J. Yaffe, "Image Quality of a prototype Direct Conversion Detector for Digital Mammography," Presented at SPIE's Inter. Sym. on Med. Imaging, (San Diego February 1999); J. G. Mainprize, M. J. Yaffe, T. O. Tümer, S. Yin and W. J. Hamilton, "Design Considerations for a CdZnTe digital Mammography System," Presented at 1998 International Workshop for Digital Mammography, Nijmegen, Netherlands (June 1998); Yin, S., T. O. Tümer, D. Maeding, J. Mainprize, G. Mawdsley, M. J. Yaffe and W. J. Hamilton, "Hybrid direct conversion detectors for digital mammography", IEEE Tran. Nuc. Sci. Vol. 46, No. 6, 2093-97 (1999); Yin, S., T. O. Tümer, D. Maeding, J. Mainprize, G. Mawdsley, M. J. Yaffe, E. E. Gordon and W. J. Hamilton, "Direct conversion Si and CdZnTe detectors for digital mammography", Nuc. Inst. & Met. Phys. Res. A. 448 (2000) 591-97; Yin, S., T. O. Tümer, D. Maeding, J. Mainprize, G. Mawdsley, M. J. Yaffe, E. Gordon and W. J. Hamilton, "Direct conversion CdZnTe and CdTe detectors for digital mammography", IEEE Tran. Nuc. Sci. Vol. 49, No. 1, 176-81 (2002); T. O. Tümer et al., "New ASICs Specifically Developed for Position Sensitive Solid State Detectors" Presented at the 10$^{th}$ Symposium on Radiation Measurements and Applications, University of Michigan (May 2002); Yaffe, M. J. and J. A. Rowlands, "X-ray detectors for digital radiography", Phys. Med. Biol. 42, p. 1-39 (1997); Yin, S., T. O. Tümer, D. Maeding, J. Mainprize, G. Mawdsley, M. J. Yaffe, E. Gorden and W. J. Hamilton, "Direct conversion CdZnTe and CdTe detectors for digital mammography", IEEE Tran. Nuc. Sci. Vol. 49, No. 1, 176-81 (2002); T. O. Tümer, S. Yin, V. Cajipe, H. Flores, J. Mainprize, G. Mawdsley, J. A. Rowlands, M. J. Yaffe, E. E. Gordon, W. J. Hamilton, D. Rhiger, S. O. Kasap, P. Sellin and K. S. Shah "High-resolution pixel detectors for second generation digital mammography", Nuc. Inst. & Met. Phys. Res. A. 497 (2003) 21-29; Yaffe, M. J. and J. A. Rowlands, "X-ray detectors for digital radiography", Phys. Med. Biol. 42, p. 1-39 (1997); T. Asaga, C. Masuzawa, A. Yoshida and H. Mattsuura, "Dual-energy subtraction mammography", J. Digit. Imaging 8, 70-73 (1995); Lewin J M, D'Orsi C J, Hendrick R E, Moss L J, Isaacs P K, Karellas A, Cutter G R. Clinical comparison of full-field digital mammography and screen-film mammography for detection of breast cancer. AJR Am J Roentgenol 2002; 179(3):671-7; Yin, S., T. O. Tümer, D. Maeding, J. Mainprize, G. Mawdsley, M. J. Yaffe, E. Gorden and W. J. Hamilton, "Direct conversion CdZnTe and CdTe detectors for digital mammography", IEEE Tran. Nuc. Sci. Vol. 49, No. 1, 176-81 (2002); T. O. Tümer, S. Yin, V. Cajipe, H. Flores, J. Mainprize, G. Mawdsley, J. A. Rowlands, M. J. Yaffe, E. E. Gordon, W. J. Hamilton, D. Rhiger, S. O. Kasap, P. Sellin and K. S. Shah "High-resolution pixel detectors for second generation digital mammography", Nuc. Inst. & Met. Phys. Res. A. 497 (2003) 21-29.

Scanning Detector for Digital Radiography

FIG. 1 shows the physical scanning motion of the digital radiography system disclosed herein. The digital nature of the imaging process permits the user to adjust the effective pixel size by combining adjacent pixels, in order to reduce the patient dose, reduce image size for data transmission and storage purposes, or enhance image contrast. With the exception of the dose reduction, these goals can be achieved after the image has been recorded, by re-generating the image from the existing detector data with different binning.

Digital radiography produces large image data sets. At 0.1 mm×0.1 mm pixel size, a typical radiograph may contain as many as 7,000×20,000 pixels, and each image pixel may consist of multiple TDI segments that will need to be retained if the capability to generate arbitrary image slices is to be maintained. The pixel sizes can range from <0.005×0.005 mm to >10×10 mm. Also digital radiography may contain <500×1,000 to >1,000,000×2,000,000 pixels. Before data compression, which may considerably reduce the data size, this can amount to gigabytes to terabytes of raw data, not including any reconstructed images that may need to be archived separately.

The disclosed system has low noise, linear response and high dynamic range of ~14 to 16 bits. The dynamic range may be extended to <8 to >28 bits for certain applications. Such a detector can be produced using a hybrid technology consisting of a converter detector layer bonded directly onto the readout integrated circuit (IC). For one embodiment of the invention, the detector layer is composed of high Z, high density photoconductive solid state materials such as CdZnTe, CdTe, Silicon, GaAs, $PbI_2$, $HgI_2$, $CdWO_4$, Selenium, used to achieve high x-ray quantum detection efficiency. Such materials directly and precisely convert the absorbed energy to electric signals, electron-hole (e-h) pairs 307. Each incoming x-ray photon produces a pulse of e-h pairs 307. Each pulse is integrated and the charges from different pulses detected by the same pixel during the same time period are summed. In TDI operation, the signal-to-noise ratio is further improved by shifting the charges from pixel to pixel. This charge shifting is done synchronous with and in the opposite direction of the scanning motion of the detector assembly, resulting in an increased effective exposure time for each image pixel and therefore improved contrast. Also, during the single movement of the detector length in TDI only a single direction in the object is viewed by each pixel of the detector because of the transfer of charge in the reverse direction. Therefore, the number of detected x-rays coming out for each pixel is in fact the integrated sum of all the pixels along the length of the detector observing the same direction inside the object imaged.

The tolerance for defective pixels will also increase detector yield and lower the cost of production. There will be no need for complicated patient positioning, because the patient will be placed on the gantry and the scanning arm with the x-ray tube will scan the whole or the selected part of the body of the patient. The response of the direct conversion solid state detectors is linear and there is no need for fine exposure control or adjustment. The x-ray tube output is lower compared to standard radiography systems and with shielding operator exposure will be minimized.

We use 10-20 cm/s scan speeds. However, scan speeds can vary from <0.1 cm/s to >200 cm/s. With 7,000 to 10,000 pixels for the full length detector array, the image size is about 7-10 K×full length of a body or a part of the body as required. Pixels may be combined into larger pixels such as 200×200 µm² or 400×400 µm² to reduce image size and spatial resolution but in turn to increase contrast.

Detector Readout Chip with TDI

In one embodiment the detector readout IC for the disclosed digital radiography system will utilize CCD-type architecture to implement a time-delayed integration (TDI) technique. The charges generated in a given detector pixel are collected in the corresponding readout pixel's charge well for a preset duration, about, but not limited to, 0.5 to 1 ms. In fact, there is no limit to the duration. It can vary from <1 µs to >1,000 s. The charges are then transferred to the next adjacent pixel in the direction opposite to the detector scanning motion, where additional charges are collected before the transfer process is repeated. At the end of each pixel column, the accumulated charges are digitized (off-chip) and the results sent to the readout computer for image reconstruction. By synchronizing the charge transfer speed with the scanning speed, the individual charge "buckets" remain stationary relative to the object being imaged and the signal acquired for a given image pixel is enhanced in proportion to the number of detector pixels per column. This condition, together with the pixel size, related to a scanning speed of 10 to 20 cm/s, not counting the small correction for the magnification between the object plane and the detector. The scanning speed is directly related to the rate of pixel-to-pixel charge transfer.

The dynamic range that can be achieved in this manner is limited by the capacity of the charge wells, about $3 \times 10^7$ electrons and/or holes, depending on the specific CCD fabrication process used, and the readout noise, $\sim 3 \times 10^3$ electrons and/or holes. To overcome this limitation, NOVA has developed a proprietary "early bypass readout" design. In this design, the pixel columns are subdivided into short (four to eight pixel) segments, each of which is read out and digitized separately, boosting the effective well capacity by a factor 16 to 32 while increasing the noise by only the square root of that factor. The charge well capacity can be designed to be anywhere in the range of $<10^3$ to $>10^{10}$ electrons and/or holes.

An added benefit of the TDI approach is that it significantly increases the tolerance for low-performing or even defective detector pixels. As such a pixel will only be one out of more than one hundred that contribute to a given image pixel, its contribution (or lack thereof) to the overall image quality will typically not be significant, and it will take multiple bad pixels in any single column to cause a noticeable deterioration. In turn, this tolerance increases the yield of useable detectors and thus contributes to achieving our goal of producing a low-cost system.

To eliminate the effect of the non-working pixels and also the detector pixel-to-pixel variations the pixel detector is required to be calibrated. The calibration can be done in a variety of ways. For example, a "flood" image can be taken using the x-ray source without an object. The image then can be calibrated to be uniform and then each pixel is assigned a weight factor required to convert its contents to the set uniform image pixel value. After this, the weight factor matrix is applied to all the pixels of the images taken with the object in position to be uniform and without any artifacts due to pixel response variations.

The averaging of the signal over a large number of pixels makes it difficult to accurately assess detector quality. Therefore, and for other test purposes and new applications such as dental x-rays, the readout IC has the capability to operate in staring (non-TDI) mode.

In the staring (non-TDI) mode each pixel observes a certain direction in the object without any charge transfer. The pixels accumulate the number of x-ray photons incident onto the corresponding detector pixel. Then the charge accumulation is stopped and the chip read out in series, pixel by pixel, or in parallel. After the readout is complete the chip can be turned on again to accumulate another image through the pixel detector.

The IC design is modeled after the MARY™ chip that NOVA has developed for its digital mammography projects. The chip architecture is largely the same but important design details will be different, requiring a redesign of the chip. Table I compares a few selected design parameters for the two chips.

TABLE I

Selected design parameters for the disclosed readout IC (preliminary) compared to those of NOVA's MARY chip.

| Parameter | New readout IC | MARY chip |
| --- | --- | --- |
| Type of charges collected | Electrons | Holes |
| Pixel size (µm²) | ~100 × 100 | 50 × 50 |
| Size of pixel bonding pads | Large, to support Alternative bonding methods | Minimal |
| Pixel count (TDI direction listed first) | 10 × 10 to 256 × 1,024 | 192 × 384 |
| Charge well capacity | $3 \times 10^7$ electrons | $1.5 \times 10^7$ holes |
| Staring mode | Included | Requires complex support circuitry |

Depth-of-Field Correction Algorithm

The normal TDI scan requires a radial or circular motion. In a straight linear scan as shown in FIG. 1 if the object to be imaged has a very short thickness it can produce good images. However, if the object has significant thickness then the images will be blurred. A new embodiment described below solves this problem.

Figure 2:
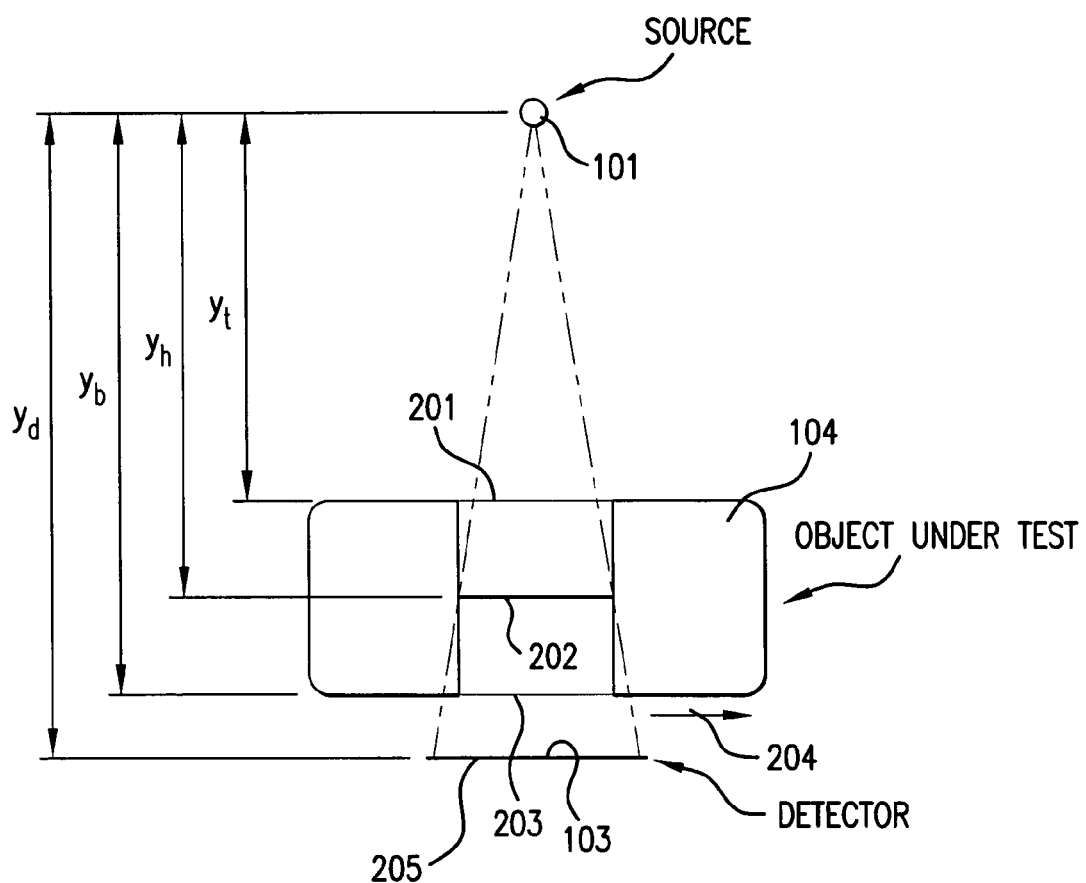
FIG. 2 is a drawing demonstrating the Depth-of-field considerations in TDI scanning.

One potential drawback of straightforward linear TDI scanning is the limited depth of field that it can achieve. To understand this, consider the sketch in FIG. 2. The fan beam from the x-ray source 101 illuminates the detector 103 after passing through the object under test 104. Consider a reference frame in which the object moves in the direction indicated by the arrow 204 in FIG. 2 while the source and detector are at rest, rather than the opposite situation that we outline here. The two frames are equivalent in physics terms, though not necessarily in practical terms. In order to obtain a sharp image of the features in the middle of the object, at a distance $y_m$ from the source, the object has to move by the length $x_m$ of the line 202 in the time t that it takes to shift the charges from one end of the detector to the other, so that the image of the line 202 moves by the active width of the detector 205, $x_d$. By simple geometric considerations, $x_m$ is given as $$x_m = \frac{y_m}{y_d} \cdot x_d.$$

Obviously, in the same time t the top 201 and bottom 203 of the object will move by the same distance. The projected images of these bars, however, will move by $$x_{b,t} = \frac{y_d}{y_{b,t}} \cdot x_m = \frac{y_m}{y_{b,t}} \cdot x_d.$$

These values are different than $x_d$ and thus out of synch with the movement of charges in the readout IC, causing blurring of these out-of-focus regions of the object.

As a concrete example, with $y_b$=150 cm, $y_t$=120 cm (that is, a 30 cm thick object), and $x_d$=10 mm, $x_b$ and $x_t$ would amount to 9 mm and 11.1 mm, respectively.

In digital mammography, this limitation is usually overcome by moving the detectors in a circular arc centered on the x-ray source spot. For a low-cost system of the proposed scale, however, this does not appear to be a viable option; moreover, the distortions that would result from projecting an extended but essentially flat object onto a cylindrical surface might themselves pose an image quality problem. Another solution is the use of a parallel x-ray beam instead of a fan beam, but we are not aware of any economically viable approach to producing a parallel beam of the required width and intensity. Moving the source far enough away that the difference between $y_b$ and $y_t$ is no longer significant would require more space than is available in any realistic hospital setting, much higher flux x-ray generator and much higher cost system. This counteracts our goal to reduce the overall x-ray flux compared to existing technology.

In one embodiment this may be overcome if the detector array and the x-ray source are rotated 90° together and the detector system is pivoted around the x-ray generator focal spot. Then the linear detector array and the source is moved similar to the direction of the standard TDI systems in an arc centered at the x-ray generator focal spot. In this case the scanning will be carried out from side to side of the patient's body and not a linear motion from head to toe.

Also, we have developed a completely different approach and new embodiment to improving the depth of field, which takes advantage of the early bypass readout design that was developed to boost the readout IC's dynamic range. In this design, the accumulated charges are not shifted through the entire length of the chip but are read out every two, four, eight or sixteen pixels. In fact, the number of pixels read out can be any number from 1 to >1,000,000. The remainder of the TDI process, splicing together the appropriate two-, four- (or eight-) pixel segments, is done inside or outside the chip, either by electronic circuits on the chip and/or outside the chip and/or the image reconstruction software and/or by field-programmable gate arrays. In hardware and/or software, the "appropriate" segments that are spliced together to generate the TDI image can be selected to match the speed with which the projection of a given plane of the object moves across the detector, thus putting that plane into focus. Over the individual segments, the blurring amounts to no more than half a pixel for the geometric parameters discussed above. The system will create multiple images, each of which focuses on a different plane of the patient's body. By implementing this solution in software, it will even be possible to make the imaging planes user-selectable.

An added benefit of this approach is that it will provide depth information to the user. For example, if an image shows a bullet lodged in the patient's body, the treating physician can vary the depth for which the image is reconstructed until the bullet is in focus and then use the resulting depth information to optimize the treatment plan, or the imaged body slices can be viewed and the one that contains the bullet will give information on the position of it inside the body. Therefore, this embodiment will produce three-dimensional (3D) slices of the patient's body. These slices will be horizontal and not vertical as in standard CT scans. However, in a new embodiment the detector array and the x-ray source is positioned at different angles to the body of the patient and produce 3D image slices of the patients body at different angles and orientations. This is a new 3D linear scan TDI approach with slice reconstruction using hardware and/or software for accumulating, processing and producing the images directly, in slices, in 2D or 3D and/or in stereoscopic format.

System Design Details

The dimensions of the disclosed digital radiography system will be controlled mainly by the length of the detector arm (70 to 100 cm, as mentioned before), the distance between the source and the detector arm (~150 cm, possibly less for a mobile system), and the length of the human body (~200 cm). By adding room for mechanical support structures, acceleration and deceleration of the scanner arm to and from the required constant scanning speed of 10 to 20 cm/s, etc., we arrive at estimated overall system dimensions (L×W× H) of 2.5 m×1 m×2.0 m for the full-size stationary system. However, these dimensions may vary from <1 m×0.5 m×1.5 m for children and small animals to >5 m×2 m×4 m for larger objects such as patient's and animals.

Another embodiment is to use another detector arm on the side illuminated by a second x-ray source. This will lead to construct vertical image slices. It will also produce both images simultaneously eliminating the need to turn the patient to his/her side if necessary. The slice information together with the two directional views will help to produce excellent 3D images.

In another embodiment, the two detector arrays can be placed at a viewing angle to each other illuminated by two separate sources. If the two detectors and the two sources are correctly aligned to the viewing angle it will be possible to produce stereoscopic imaging of the patient's body.

Another Embodiment

Because of the practical size limitations of the fabrication technologies for both the IC readout chip 304 and solid state detector such as CdZnTe detector 301, it is not feasible to fabricate a continuous linear array detector of the required length using silicon ICs and CdZnTe material. The solid state detector can be selected from anyone or a combination of solid state detectors such as Silicon, Selenium, Germanium, GaAs, CdTe, CdZnTe, $PbI_2$, $HgI_2$, $CdWO_4$ and other old or new detectors. In one embodiment the array is assembled from smaller detector hybrids. For best performance, neither the detectors nor the ICs can have active pixels extending all the way to the edge of the material, so a straight array would end up having inactive areas that would lead to gaps in any image created by the system. It is not a good idea either to use a flat linear array 901 because of the significant thickness of the detectors, up to 2 mm, required to achieve high DQE in CdZnTe for digital radiography at x-ray energies up to ~100 keV. Different applications may require different thickness, width and/or length for the detector array. All the different sizes can be designed and built using this invention. Under a fan beam most x-rays would enter such a flat detector array at an angle and have a good chance to penetrate into adjacent pixels and produce blurring. To avoid this scenario, the individual detectors need to be tilted 902 so that their cathode surfaces are perpendicular to the incoming beam or they can be mounted onto a curved surface such as an arc. Therefore, we use detectors that are approximately 10 mm wide by 20 mm long, which is the maximum size for fabricating both ICs and CdZnTe with good yield and low cost, and place them into a staggered linear array 903 with overlaps. The overlapping is important so that the pixels at the two edges of two adjacent pixel detectors image the same section of the object. This will improve the images on the two ends of the pixel detectors where one expects higher number of non-working channels. In fact, in another embodiment the staggered array detectors can be positioned to overlap totally or mostly. This will provide improved imaging all around as the number of pixels observing the patient is mostly doubled. The detector array can be mounted on a detector arm 905 with a mounting bracket 902. The detector signals can be processed with data acquisition electronics 904.

Abutted flat or curved linear arrays can also be used. In this case the distance between the two detectors is made as short as possible so that the dead area where no image is produced is minimized or reduced to zero. Another embodiment is to make the array from a continuous detector without any gaps. The detector array can also be made nonlinear depending on the application.

The solid state detector 301 has pixels 310 fabricated on its surface as electrodes. The readout chip 304 also has pixels 303 fabricated to match the pixels of the detector 301. The detector 301 is bonded onto the chip 304 through bump bonds 302. The bump bonds can be made from a conductive material such as indium, lead, solder, tin, graphite, copper, aluminum, silver, gold, platinum, and conductive epoxy. The bumps can be put only one surface either the pixels on the chip or the detector. Or it can be put on both surfaces in any combinations such as gold with conductive epoxy. The pixels on the detector pixel array and the ASIC are then connected together through these bump bonds 302 and hybridized. The top of the detector 309 can also have a single or pixelated electrode. A voltage source is connected to this electrode or pixels to form an electric field 308, in a format that is required by a specific application. The x-ray 306 and gamma rays then enter the detector substrate and produce e-h pairs 307, which move in opposite directions under the influence of the electric field 308 and the charge goes through the detector pixel 310 and bump bond(s) 302 and is collected by the ASIC's 304 pixel 305.

The time-delayed integration concept is used for this technique to build a low-cost, high-resolution, low-dose, and fast digital radiography system for full-body imaging with 3D image construction capability. This technology will add the third dimension to the images obtained, by letting the user focus on different depths. In this sense, the system will then offer the option of quasi-tomographic imaging.

A compact portable version of the detector with radio signal communication capability can be made that can be mounted on a conscious and mobile subject. The wireless communication with the detector may also use other techniques such as different radio wavelengths, visible, IR, UV, microwave, mm wave, sound, ultrasound, etc. This detector can relay images of the distribution of a radiotracer while the small animal is doing its normal functions.

Some of the properties of the invention are listed below:

1. Each pixel on the readout chip is multiplexed to a single output and read out in a raster scan mode or other modes such as in series per pixel row and/or per pixel column, and/or parallel and or some parts in series and some parts in parallel.

2. Fast trigger output is produced with low jitter for coincident detection of annihilation photons for applications such as PET.

3. Detector pixels DC or AC coupled to the readout ASIC pixels.

4. Use a two-dimensional (2D) array of resistance and/or capacitance chip to achieve AC coupling. This chip may also be used without capacitors and/or resistors, or other circuitry can be placed onto this chip such as JFET transistors. This chip is sandwiched between the 2D detector array and the 2D pixilated readout chip. This chip is bump bonded onto the readout ASIC and the detector array is bump bonded onto this chip. To achieve sandwich type mounting, this chip requires deep vias, and/or both surface processing, which connect the resistance and/or capacitance inputs/outputs to both sides of this chip. Or a ceramic substrate can be used with matching metal or gold pixels on both sides. The pixels on both sides are connected to each other through plated through holes or vias. Capacitors and/or resistors may be fabricated into and/or onto this chip to achieve A/C coupling of the detector's pixel output to chip's input. This chip is bump bonded onto the ASIC or detector and then the other one is bump bonded onto the other side. Therefore, this chip is sandwiched between the ASIC 304 and the pixel detector array 301. It will use similar type of bump bonding 302 to connect to the ASIC and the detector from both sides.

Figure 11A:
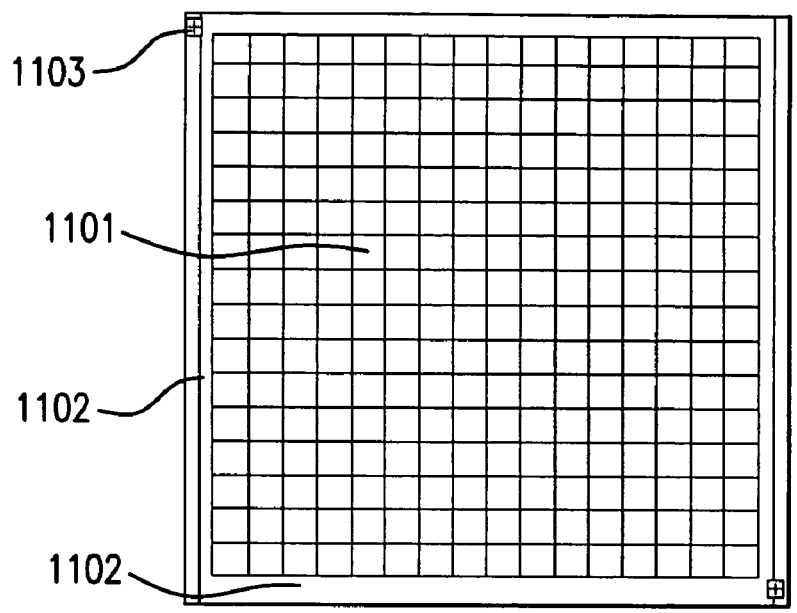
FIG. 11A is a block diagram showing the geometry and structure of the pixels on a solid state detector pixel array utilizing a ring guard.
Figure 11B:
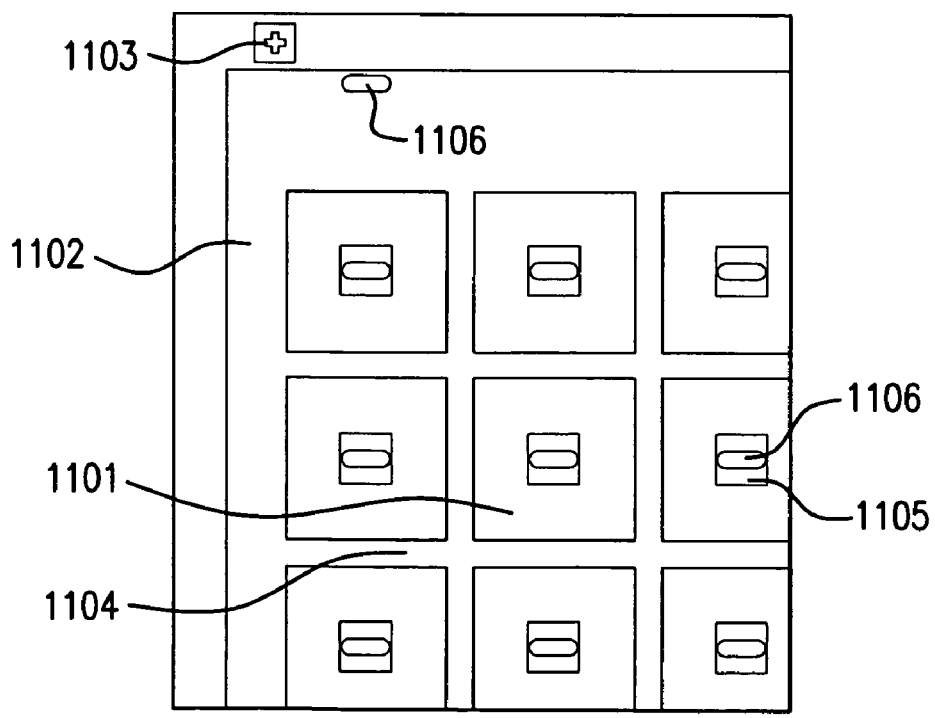
FIG. 11B is a block diagram showing the geometry and structure of the pixels on a solid state detector pixel array utilizing a grid in place of a ring guard.

5. Detector may be designed to have a guard ring 1102 around the perimeter of the pixels 1101 as shown in FIGS. 11A and 11B. The detector also contains alignment marks 1103. Pixels are made from a blocking or unblocking type conductive material such as conductive epoxy or paint, copper, aluminum, indium, silver, gold, tungsten and/or platinum. FIG. 11B shows a different pixel arrangement where the pixels 1101 are surrounded by a grid 1104 which may be connected or unconnected to the guard ring 1102. There may be more than one grid surrounding the pixel area. One or more grids around each pixel steer the charge onto the pixel pad 1105. This arrangement may work as a Frisch Grid structure on each pixel. This grid 1104 and/or pixel pad 1105 can have any type of geometry, number, material, size, shape, symmetric, asymmetric depending on the application. Also any size voltage(s) can be applied to the grid(s) 1104. The grid 1104 system improves energy resolution of each pixel 1101 especially when a voltage applied to the grid(s) 1104 to steer electrons (or holes) onto the pixel pad 1105. The indium bumps 1106 are also shown.

6. The area inside the adjacent pixels may be used for placing electronics circuitry of a pixel.

7. It may have different pixel sizes and geometries on the same pixel detector and ASIC as required by different applications.

8. It is designed to work at, or above or below room temperature.

9. It may be designed to image under low and/or high x-ray and/or gamma-ray flux.

10. It may be designed to have wide energy range of about 1 keV to over 1,000 keV.

11. Good tolerance can be built in to accommodate high detector leakage current.

12. CdZnTe detectors can be used with two thicknesses, such as less than 1 to higher than 5 mm for Gamma Camera, CT & SPECT and less than 5 to higher than 15 mm for PET, security, industrial, NDE, NDI, and NDT imaging. Two or more pixel detectors can be placed on top of each other to detect both very low energy and also very high energy x-rays and/or gamma rays.

13. Fast trigger output is provided with low jitter for coincident detection of photons or particles such as the annihilation photons for applications such as PET.
14. Two or more energy ranges may be designed, such as below 10 to above 200 keV and below 100 to above 1,000 keV, to accommodate different types of applications such as Gamma Camera & SPECT, PET, CT, security, industrial, NDE, NDI, and NDT imaging.

Mounting Detector Pixel Arrays onto Readout Chips

We have discussed above mounting detector pixel arrays onto the readout chip using bump bonding technique. In another embodiment the detector material can be directly deposited onto the readout ASIC (pixelated surface) using techniques such as evaporation, sputtering and electrochemical deposition. Another technique is to grow the detector material on the chips pixelated surface by using techniques such as liquid phase epitaxy, single or amorphous crystal growth. It is important to produce sufficient thickness quickly with good electrical contact between the detector material and the ASIC pixel input pads. This technique can produce low cost pixel detectors.

Detector Detailed Description

Such detectors can be produced using a hybrid technology involving a pixilated converter layer in which high Z, high density photoconductive materials are used to achieve high gamma ray quantum efficiency. Such materials directly and precisely convert the absorbed energy to an electric signal. The absorber layer is hybridized to a readout device that allows the signal to be collected directly and efficiently, digitized and stored in a computer as an image matrix. Materials such as Silicon, GaAs, Selenium, Germanium, $PbI_2$, $HgI_2$, CdTe, CdZnTe have potentially excellent properties as the x-ray detector and have demonstrated this potential in work to date. Since these detectors are hybridized to Application Specific Integrated Circuits (ASICs), they are very compact in size and ideal for imaging x-rays. We also disclose a mixed signal readout ASIC for directly reading the 2-D detector array pixels.

The key element in the detector must convert the x-rays into electronic signals. Important detector properties are dynamic range, quantum efficiency, sensitivity, noise characteristics, linearity, uniformity and the ability to provide high spatial resolution over the required area. First generation detectors employ scintillators to convert x-rays into visible light, which is subsequently converted into an electronic signal. Because of the intermediate conversion stage, this process is inefficient, and could lead to higher signal noise. In a pixel detector the light produced in the scintillator propagates isotropically and, if the detector thickness is not sufficiently small, it can diffuse into adjacent pixels and cause blurring. Columnar scintillator structure has alleviated this problem but it is costly to manufacture and produces signal loss for crystals with very narrow aspect ratio.

Each 80 keV x-ray photon produces about $2.1 \times 10^4$ e-h (electron-hole) pairs in CdZnTe and a 1.5 mm thick detector will stop about 99.8% and 90% of the 50 and 80 keV x-rays, respectively. 1.5 mm to 2.0 mm thick CdZnTe detectors 301 will be used for this application depending on the selected x-ray generator peak working voltage. For a typical medical radiography machine the x-ray tube voltage can be set at up to 180 kVp. We use a 3 mm Al filtration and the intensity maximum will be between 30 to 50 keV depending on the power supply. In one embodiment we select an x-ray generator with 70 to 100 kVp supply.

Slot-Scan System Using the Time Delay Integration (TDI) Technique

In one embodiment the individual detector unit has 96 to 128 stages in the TDI direction and 192 to 256 columns in the non-scan direction. The detectors are abuttable up to the full body x-ray image width (~70 cm) or it can be abutted to any required length. The detector pixel size will be between about, but not limited to, 50×50 to 100×100 $\mu m^2$ with about 100% fill factor and the overall size of about, but not limited to, 10 mm by 20 mm for each detector module.

The readout chip also operates in a flash mode where static staring images are obtained for detector diagnostic purposes. High resolution of 5 to 8 lp/mm MTF depending on the pixel size and 50% to 70% DQE at zero spatial frequency is achieved. However, better MTF and DQE approaching the theoretical limits is possible with the detectors developed under this invention.

Each pixel holds $3 \times 10^7$ electrons and the readout noise at each output buffer is $3 \times 10^3$ electrons. Because of the 128 TDI stages and the early bypass readout design that boosts the effective well capacity by up to a factor of 32, the effective dynamic range can be increased to $6 \times 10^4$ or 16 bits. These numbers are exemplary to the prototype detectors built. Therefore, new versions of detectors developed using this invention have the capability to increase these numbers significantly.

Hybrid Pixel Detector

Figure 3A:
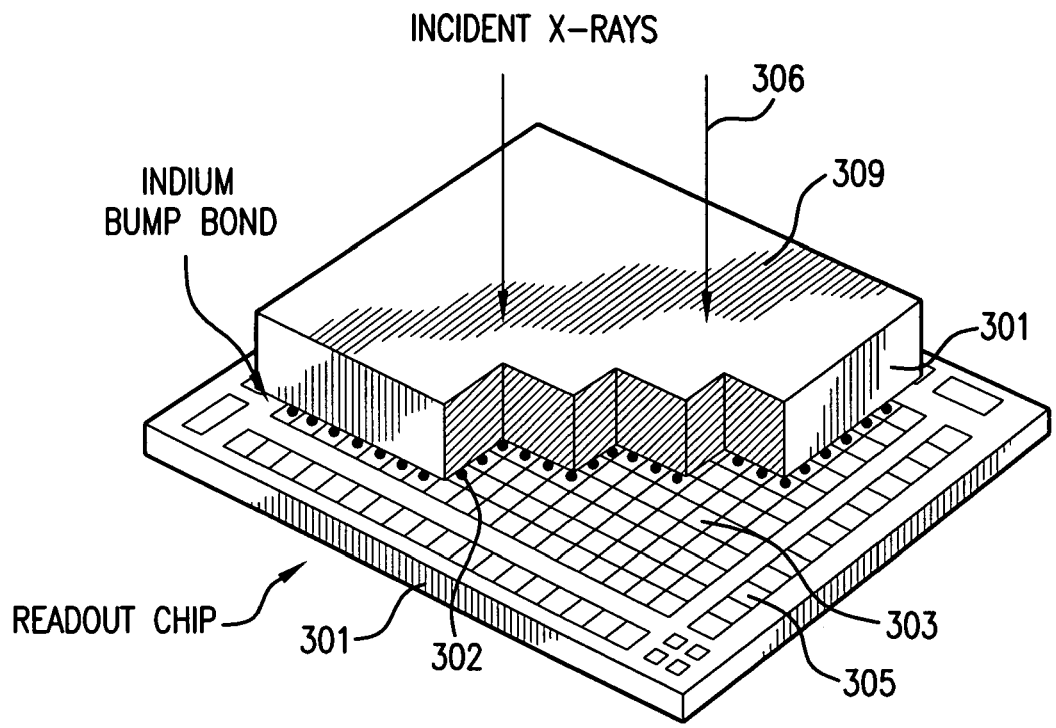
FIGS. 3 A and B is a drawing of the hybrid CdZnTe pixel detector with CdZnTe pixel array and detail of the indium bump bonding onto the readout ASIC chip.

FIG. 3 shows a drawing of the hybrid pixel detector and its internal structure. It shows the pixilated CdZnTe detector 301 301 on top with HV bias electrode. Under the CdZnTe the pixilated array ASIC 304 is shown with indium bumps 302 at each pixel input. CdZnTe 301 pixel array also has indium bumps on its pixels matching the pixels of the ASIC. The detector is aligned on top of the ASIC and pressed together to form a cold bond.

ASIC Design

Figure 5:
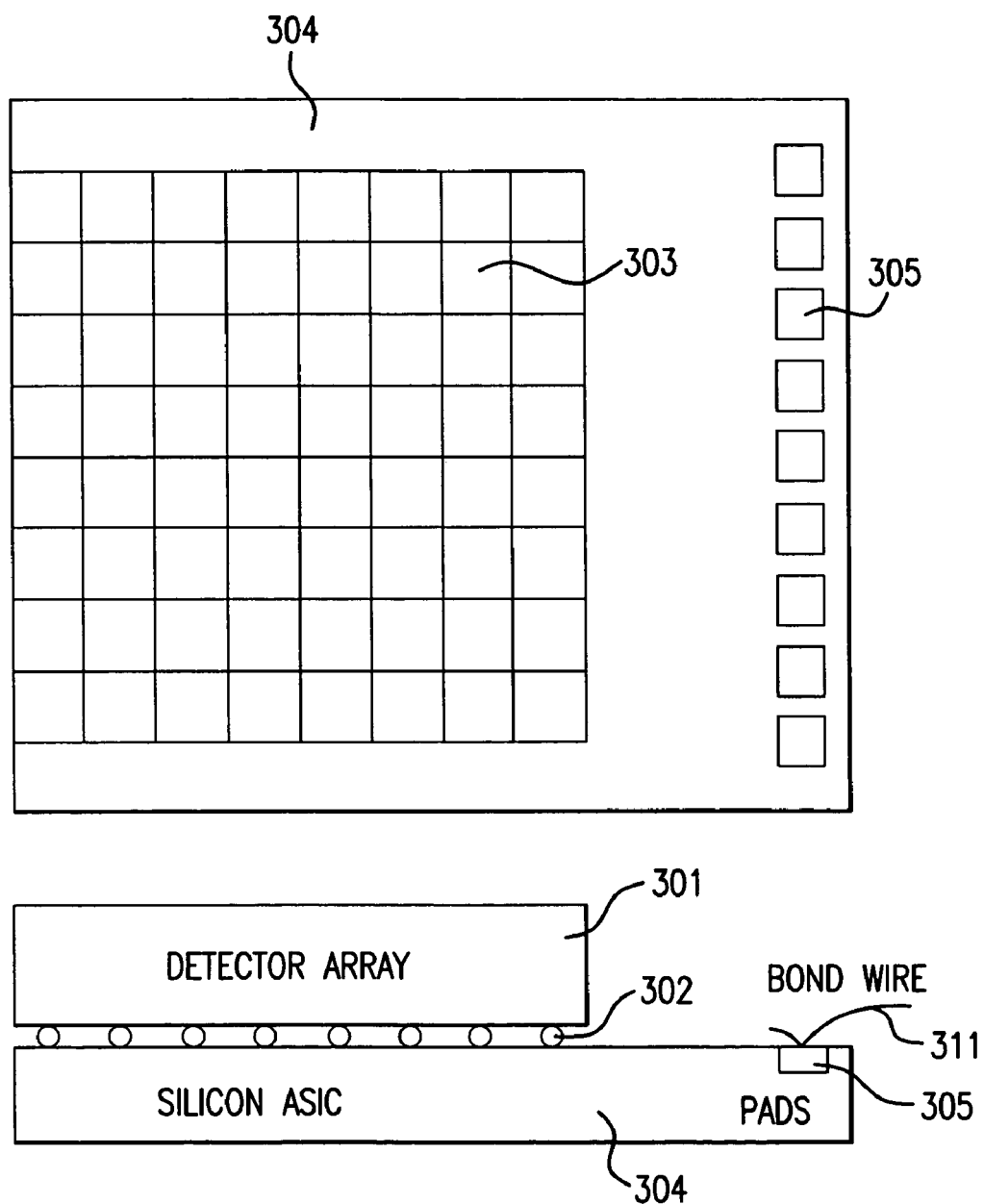
FIG. 5 is a drawing of the Overall Geometric Concept for DANA IC.
Figure 6:
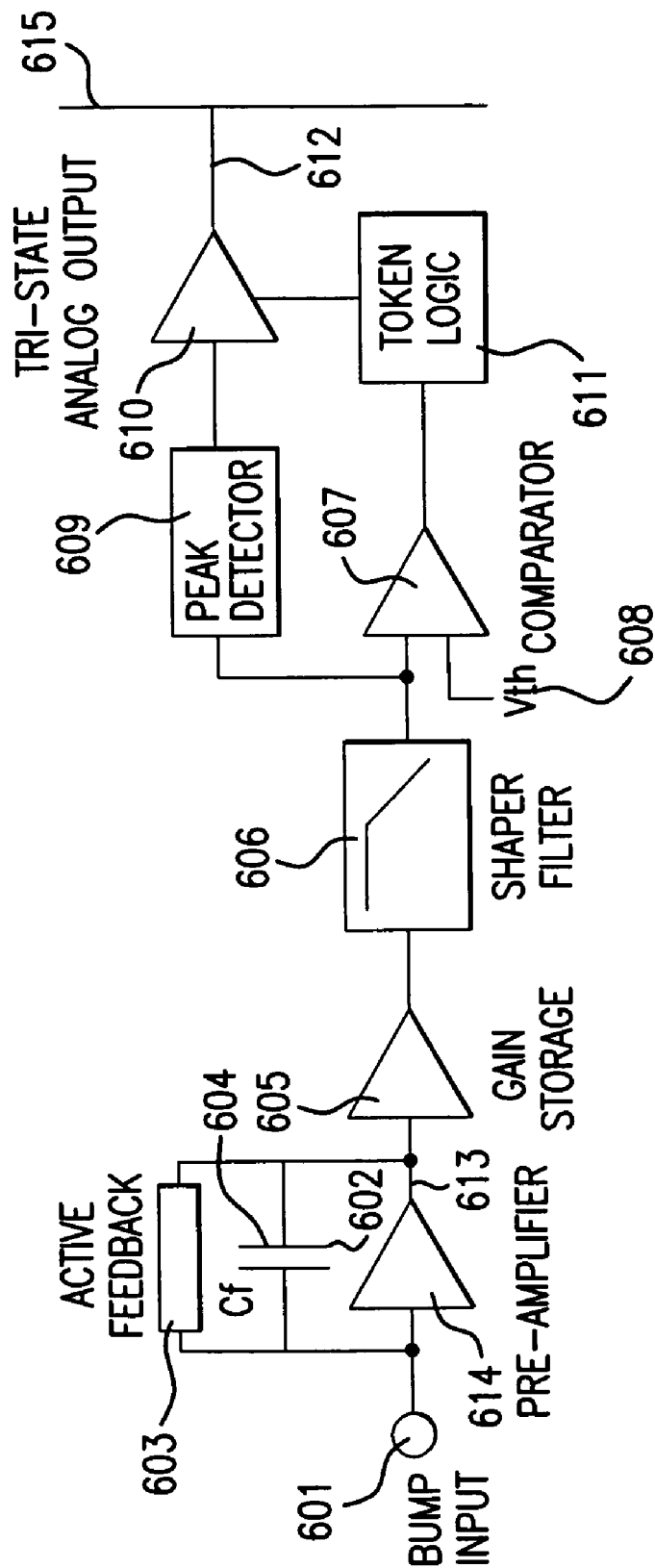
FIG. 6 is a drawing of the Signal Chain of DANA IC.
Figure 10:
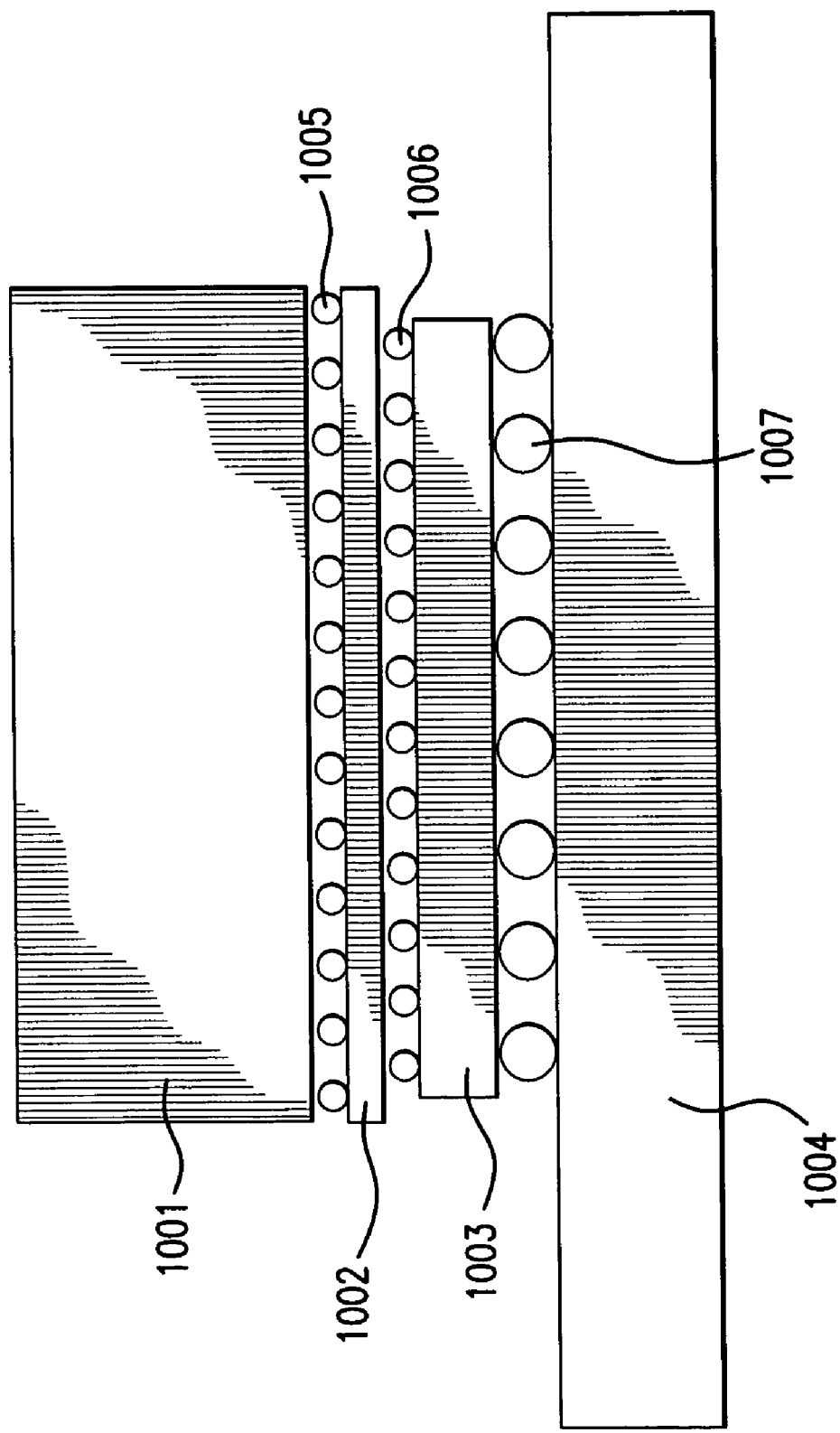
FIG. 10 is a block diagram of a four side abuttable pixel detector shown mounted onto a ceramic or printed circuit board.

A custom 16×16 ASIC for 300-μm-pitch detectors which is designed to be abatable on two or three sides to facilitate tiling has been developed. It is also possible to fabricate detectors, which are abuttable on one, two (FIG. 3), three (FIG. 5) or four (FIG. 10) sides. If the ASIC is abuttable on two sides 4 of them can be placed abutted at the two sides to produce a 4 times the area without image artifacts. If the ASIC is abuttable on three sides linear arrays with two rows can be produced any length fully abutted. If the ASIC is abuttable on four sides then 2D arrays can be fabricated any size area fully abutted without producing significant loss of signal or image between the pixel detectors.

To fabricate 4 sides abuttable pixel detector (FIG. 10) the solid state detector pixel array 1001 is mounted on an ASIC 1002 using bump bonding 1005. The hybridized detector may include a special connection or A/C coupling chip sandwiched in between the detector 1001 and ASIC 1002 as described above. The hybridized detector is then bump bonded 1006 onto another connection chip 1003 or a ceramic chip 1003 similar to the connection chip described above. This chip has deep vias or plated through holes, respectively. It is used as a Ball Grid Array (BGA) and mounted onto a ceramic or printed circuit board 1004 using solder balls 1007 or bump bonding. In this technique the ASIC 1002 and connection (BGA) 1003 dimensions are smaller or equal to the same dimensions of the solid state pixel detector array 1001. Therefore, the hybridized detectors using BGA technique can be placed side by side in a 2D array fully abutted to build large area detectors.

In making abuttable pixel detectors it is also important that the guard ring 1102 (FIG. 11A) around the pixelated 1101 active area of the solid state detector is also made thin to reduce the inactive area on the perimeter of the pixel detector. This will help reduce the loss of signal and/or image further. In another embodiment, the guard ring can be built or fabricated around the sides of the detector substrate allowing the pixels to come in touching distance to the edges of the detector. This will allow the smallest possible gap between the pixel detectors, improve abutting and will eliminate artifacts in the images. In another embodiment (FIG. 11B) the grid 1104 can be used instead of a guard ring. Since the grid structure has the same pitch as the pixels it can come in touching distance to the edges of the detector.

The ASIC uses identical analog processing chains for each of the 256 pixels and is designed to be compatible with both CdZnTe and silicon since it is externally configurable for detection of positive or negative charges. The identical shaping time constant for each chain can be selected from about 250 ns to 15 µs to accommodate different charge collection times.

The chip has three parallel logic inputs that select one of eight functional modes. In normal operation the chip waits in Mode 0 for an x-ray event to occur. When this occurs, a trigger flag is set in each pixel where the peak-detector voltage exceeding the threshold voltage. When one or more trigger flags is set the ASIC's trigger output is raised, alerting the processor controlling the chip. To read-out the event the chip is put in Mode 1, where the pixel number and held analog peak voltage are output for each triggered pixel, in an order determined by the chip, with the readout timing controlled by a clock input to the chip. After the last triggered pixel is read out, the trigger output is lowered. The ASIC may then be put in Mode 2, where the peak voltage for additional pixels may be read out by inputting the pixel number on the ASIC's address bus, and pulsing the chip's clock input. After the readout is complete, the ASIC is put in Mode 3, where capacitors in the analog electronics are discharged, and digital signal paths reset. This refresh cycle, which requires about 50 µs, is followed by a return to Mode 0, to await another trigger. In the absence of any triggers the refresh cycle must still be preformed periodically (~every 100 ms) because of charge build-up resulting from detector leakage current.

Mode 4 and 5 are used for disabling and enabling the triggering in individual pixels, allowing any noisy pixels to be masked. Mode 6 and 7 are for enabling and disabling for individual pixels the input of an external calibration pulse into the front end of the pixel analog electronics.

The operation of the ASIC is also configurable through an eight-bit control register, which is input serially. This allows selection of positive or negative input from the detector; selection of a global enable or disable of the test input; and selection of a single external trigger enable/disable or the individual pixel trigger enable/disable. In addition for testing of individual pixels, voltage output from a single pixel can be selected, with the voltage either from the output of the shaper circuit, or the peak detector held voltage.

ASIC Performance

It is desirable that electronic noise be minimized. This noise is a combination of chip noise coupled with the capacitance of the CdZnTe pixel and its leakage current and noise injected from peripheral circuits such and power supplies, voltage references and noise pickup. Fortunately the CdZnTe pixel capacitance and its leakage current are proportional to the area and the volume of the pixel, so that the fine <10×10 µm$^2$ to >10,000×10,000 µm$^2$ pixel pitch can be used. The fine pitch reduces both the leakage current and the pixel capacitance. The ASIC's input MOSFET transistor for the charge sensitive amplifier has been optimized through SPICE simulations to achieve minimum noise. In addition, the transistor gate size is designed to match the detector input capacitance.

The input charge sensitive amplifier is designed for ultra low noise operation. For example, a pure integrating charge sensitive amplifier, a self resetting charge sensitive amplifier and/or a transconductance amplifier, etc. can be used to achieve low noise. However, pure integrating type amplifier requires very low detector leakage current because the leakage current is continuously integrated and the baseline increases requiring periodic resetting of the whole chip to keep the energy resolution high.

CdZnTe Pixel Array Fabrication

The electrodes are formed on the CdZnTe 301 after polishing and pacification of the surface. The detector is then indium or solder bump bonded 302 on to the electrodes 303 or pixels of the CdZnTe crystals. Other bonding techniques such as gold or platinum stud bonding, asymmetrically conductive epoxy or film bonding may also be used. The pixel array can consist of 2×2 to over 1,000,000×1,000,000 array of less then 10×10 micron$^2$ to over 10×10-mm$^2$ pitch conductive such as gold, platinum and/or indium pixels (FIG. 3). The pixel geometry can be square, rectangular, circular, elliptical or any other shape.

After the crystals had been prepared, indium bumps were deposited both on the crystal readout pads and on the corresponding ASIC pads. Using alignment marks, the two were then pressed together to fuse the bumps, a process which takes place at room temperature. If necessary, an underfill of insulating epoxy can be used between the ASIC 304 and the CdZnTe 301 to provide additional support and provide a more robust assembly. In practice, with a large number of small pixels, this is not usually necessary and was not done with these pixel detectors. Instead of underfill it is also possible to epoxy the corners or the side edges to secure the solid state detector pixel array onto the readout ASIC.

CdZnTe Material Quality and Leakage Current Compensation

It is important that the resistivity of the CdZnTe material used for this pixel detector is high. Although the front end charge sensitive amplifier of the new ASIC is designed to tolerate higher leakage current lower leakage current will result in better energy resolution. The front end amplifier of the readout chip has a reset circuit which is a resistive feedback. This circuit cancels the leakage current coming in and keeps the input amplifier's output or offset from changing as the leakage currant from the detector is integrated. The feedback circuit can be made in many different ways, such as an active and/or passive resister with or without a capacitor, one or more MOSFET or other type of transistors, etc.

Pixel Detector and Readout ASIC Design Features

Staring array applications may need mounting of the individual pixel detectors in a 2D array where each pixel detector is abutted next to the other pixel detectors. If the two sides of the readout chip then up to four chips can be abutted to produce an active area by up to 4 times larger then the individual chip active area. If the readout chip is abutable on three sides then linear arrays of any length can be made with one or two chips wide. Or in another embodiment any size 2D array can be formed by placing the wire bonding section of the chip under the chip below it. This requires that the pixel detectors are slightly tilted in order to give room for the bonding of the chips before it. This tilt is small and does not produce significant artifact in the image.

Scanning type applications may require the Time Delayed Integration (TDI) technique to be used. The scanning requires a linear array. The linear array may be based on a single chip abutted into a linear array or two chips abutted on opposite ends into a linear array. The linear array may also be formed by using a staggered array 903 of chips and also may be formed by much wider width using three to more chips along its width and/or TDI motion direction mounted as described above.

Input Amplifier

The input amplifier 403 may have many different forms, such as a charge sensitive amplifier 403, a transconductance amplifier, an operational amplifier, current amplifier, voltage amplifier, low noise amplifier, etc. The charge sensitive amplifier requires large gain so that the small amount of charge created inside the detector can be amplified and detected with good energy resolution. This also means that it must have low noise. One embodiment of the chip's input amplifier described is a pure integrator with only capacitative 410 feedback. Although such a circuit has low noise it is susceptible to continuous leakage current from the detector. The leakage current is integrated continuously and the amplifier output keeps rising and any signal received rides over this pedestal and its pulse height, which is proportional to the x-ray photon energy, is added to the pedestal. The solution to this problem is to use low leakage current detector and/or to reset the amplifier periodically to bring the pedestal to zero or use a charge sensitive amplifier, which is not highly sensitive to the leakage current.

One embodiment is a charge sensitive amplifier with a resistive 603 feedback in parallel to the capacitative 604 feedback. The feedback capacitance is in the range of a few fF to tens of fF depending on the required dynamic range. The presence of the resistive feedback cancels the DC current component which is due to the leakage current and does not allow the input amplifier base line or pedestal, as sometimes called, to rise. In effect, the base line signal level at the output 613 of the input amplifier changes to compensate for the DC leakage current due to the resistive feedback. This, of course, is only true within the design range. Once we determine the CdZnTe resistivity range to expect we are able to set the upper limit for the maximum leakage current expected by designing the resistive feedback circuit to compensate for it. There are several different embodiments to do the resistive feedback circuit.

The first embodiment is to use a passive resistance in the feedback circuit. This is limited on how much resistance can be built into the chip at the feedback loop of the input amplifier at the input of each channel.

The second embodiment is to use resistive multiplier feedback circuit, which is an innovative way to create a linear element (a resistor) with active MOSFET components. This circuit uses current mirror divider circuits configured as an extremely small transconductance amplifier to make an equivalent resistor greater than 200 MOhm ($2\times10^{+8}$ Ohms). A small 100 KOhm resistor is used as the reference device for this circuit. A measurement of current going through the 100 KOhm resistor is made and a new current level of 1/200th the magnitude is driven at the output pin. The resistive multiplier circuit achieves high resistances in a small area because it replaces the large area required for a large linear resistor ($>10^8$ Ohms) with a circuit of area 0.042 mm$^2$. A resistor of 200 MOhm made from 1 kOhm/square (Ohms cm length/width thickness) polysilicon would be 1 mm$^2$ in size for a 0.5 µm process. Also, a large resistor element would suffer from RC delay effects, which the active circuit is not subject to.

The third embodiment is to use a MOSFET transistor as a resistive feedback circuit with its resistance is externally controlled. Such circuitry can be used to produce a large resistance feedback component, $>10^9$ Ohms. It has a much smaller area, about 0.001 mm$^2$. Therefore, it is especially appropriate to use for smaller pixel sizes such as 250×250 µm$^2$ pixel pitch. It can be added as an option to the resistive multiplier circuit during the prototype fabrication so that it can be tested and evaluated in comparison to the resistive multiplier circuit. Unfortunately, MOSFET resistive element is nonlinear and also it may not be used with the pole-zero cancellation circuit.

The fourth embodiment is to use a combination of these feedback resistance circuits. The capacitance feedback may also be added to these different feedback circuits.

The fifth embodiment is to use a circuit to sense the variations in the input amplifiers output and restore the output to a preset value. In this case the sensor circuit need to respond slower than the pulses coming from the detector so that it will allow the detector pulses while restore the slow changes in the output due to the leakage current coming from the detector.

The sixth embodiment is to use a circuit to anchor the output of the input amplifier to a fixed value such as ground. This circuit is made to allow the fast detector pulses to go through as it will be designed to be slower to respond than the detector signals.

The normal input amplifier size is expected to be about 0.023 mm$^2$ for about 9 pF input capacitance. This size can be reduced further. We expect this to be feasible, especially because the input capacitance is <1 pF for CdZnTe pixel detector application and the optimized input gate size to match the input capacitance is, therefore, significantly smaller. The presence of a resistive element in the feedback may increases noise.

Pole-Zero: Dc Coupled Feed Forward Circuit

A pole-zero cancellation circuit, well known in the art, is built to improve the response to high count rate applications which are expected for medical imaging. This circuit restores the baseline and prevent pulse pileup when count rate approaches the limitation imposed by the shaping time. The area of this circuit is expected to be about 0.06 mm$^2$ in general and can be reduced further. However, a good place to put this circuit is after the input amplifier 614.

Two Pole Shaper Circuit

A two pole shaper circuit 405, 606 is built. This shaper circuit can be designed using many poles. This circuit can have 2 to more than 256 selectable different peaking times starting from less than 0.001 µs to over 100 µs or more. The standard circuit has 0.08 mm$^2$ area with 8 selections. We reduced the number of selections and the circuit area so that the pixel pitch can be minimized. The aim for this circuit is to produce high energy resolution. Therefore, speed is not an important issue. However, the peaking time selection is important for compromising between energy resolution vs. count rate. This circuit can be placed at many different places.

Comparators

A comparator circuit 407, 607 is used to produce an event trigger using the shaper output. This is essential as this trigger signal notify external circuitry that an event has been received so that an external process that reads out the ASIC can begin. It is also recorded into the pixel address register and the sparse readout circuit or hit register. The input amplifier/shaper base line level is restored by a programmable 8-Bit DAC offset control and the comparator threshold is adjusted by a programmable DAC so that a uniform response can be achieved through calibration. The expected area of the comparator circuit with adjustment circuits is about 0.0095 mm² for the comparator and 0.0427 mm² for the DAC if a 0.5 micron process is used. These circuits are simulated, minimized and optimized for this application. The size of the DAC can be also reduced by lowering it to 6-Bits or lower if necessary.

A second or even more comparators for lower and/or upper level discrimination may also be added to the circuit for each channel. In this case the comparators are set, some below the peak and some above the peak and some below and above background region(s). When a trigger is received from the first comparator the external circuit looks for a flag from the second or other comparators if it is absent it expects that the event is within the peak and reads it out. If there is a flag then it ignores the event and resets the ASIC. This method is especially useful if the radiopharmaceutical applied has several peaks and a peak below the highest is being observed. Also it will allow easy background subtraction if a background region and a peak region are observed at the same time. This also allows increased data acquisition rate capability as unwanted data can be ignored and the chip is reset. If the second or any other comparators are deemed not necessary for this application they may be omitted to keep pixel area small.

Fast Comparator

One or more fast comparators may be used. The circuit can be a leading edge comparator and similar to the one that is used above. It has programmable DAC based threshold adjustment. The estimated area is similar to above. Improved fast comparator circuits such as a constant fraction discriminator, zero crossing discriminator, rise time compensated discriminator or comparator can be incorporated into the chip. The fast comparator produces a fast trigger signal, which may be used for the event arrival time determination or coincident event recording.

Peak Detector

Peak detector 406, 609 circuits are well known in the art. This circuit holds the signal in each pixel at its maximum value until the pulse height is measured and the circuit is reset. This circuit is critical for good energy resolution. Other circuits such as track-and-hold, peak-hold, track-and-hold and/or sample-and-hold circuits may also be used. The expected area of the circuit is about 0.039 mm².

Sparse Readout

The sparse readout capability is important for 2-D pixel detector circuitry due to the large number of pixels. The sparse readout system allows the external circuitry to readout only the pixels which have data or produced a trigger. In this application the majority of the events are expected to trigger a single pixel. Therefore, sparse readout saves significant readout time and software overhead later. In this circuit, the peak value of the first pixel which has produced a trigger is connected to the output and its address is also made available to the outside world. The external circuitry downloads the address and digitize the pulse height and inform the chip it is done. Then the chip automatically drops to the second pixel, which has produced a trigger, if there is one, and display or output it. The circuitry for this feature is outside the pixel area.

Near Neighbor Readout

In a small pixel 2-D detector it is quite likely that the charge is shared between adjacent pixels. Therefore, one or two or three neighboring pixels may produce a trigger but the other pixels surrounding them may also have some charge. Therefore, to get the maximum energy resolution it is good to read out the charge collected by the neighboring pixels. In this mode, the chip produces a hit register, which shows which pixels produced a trigger. The external circuitry downloads the hit register and then it automatically reads the pixels, which produced a trigger and also the neighboring pixels around them. This is only necessary if probability for charge sharing is significant, which is true for small pixel size and thick detectors. If charge sharing is not significant the near neighbor mode can be turned off. The circuitry for this mode is external to the pixel area. This circuit can also be developed in hardware on the chip. It can have a lookup table, which tells the circuit which pixel contents it should connect to the outside together with its address.

Other Circuits

A test pulse circuit at the input of each channel or pixel is implemented so that each pixel or channel can be tested by applying an external pulse. Also the input of each pixel can be turned on and off. This is useful during testing and calibration. A polarity selection circuit 404 may be built in so that the input to the amplifier can be selected to be electrons or holes. These circuits are designed inside the pixel area but has minimal impact on the pixel size. We also built two or more additional full featured analog channels connected to the chip readout system on the periphery of the ASIC outside the pixels with inputs connected to wire bond pads of the ASIC. These analog channels are mainly used to readout the cathode electrode deposited onto the top of the detector to determine the depth of interaction of the x-ray or the gamma ray using the pulse height ratio between the anode and the cathode or the time difference between the pulses received between the anode and the cathode on the detectors. Other channel(s) can be used to process the signal from the guard ring and the non-collecting grid. These peripheral channels may be connected to pads on the perimeter of the chip. They may be also connected to external detectors for testing. The circuitry for the depth of interaction determination such as cathode/anode pulse height ratio can be built onto the ASIC or it can be done externally.

Current integrating circuits may be used instead of or combined with the pulse counting circuits on the readout chip at each pixel. This will allow selection of either function or use both functions at the same time. The current integrating circuitry normally have a noise and/or other background signals that cannot be subtracted, however, it can accept extremely high rates if necessary. The photon counting detectors normally have non or very low background as the noise or other unwanted external pulses can be eliminated using the comparator(s) and/or discriminator(s).

Analog to digital converters (ADCs), digital to analog converters (DACs), state machines, programmable gate arrays and microprocessors may be included on the readout chip to carry out functions that are done presently outside the chip. This will reduce total size of the readout electronics and make very compact detectors, such as detectors for in vivo molecular imaging of mobile and conscious small animals.

Token Logic circuit 611 is included for each pixel cell. Initially the token registers are reset. Then each of the cells gets a pulse from the comparator at different times. The token present signal is initially in the first cell. Upon receiving the token clock, the token is passed from one cell to the next until all cells have been read. Then the last token out signal goes to a one and to an output signifying that all cells that received a hit have been read.

A driver or a buffer circuit 610 is used to output the analog peak detector signal to the output 612. Token logic 611 output can be used to control the data output 612 to a bus 615. The data bus 615 can be a tri-state bus. The driver circuit can also be a differential driver 408 with differential output 409.

A Two-Dimensional Pixel Readout Chip with Self Resetting Input Amplifier

The DANA integrated circuit is designed for direct connection to an array of detector diodes and/or pixels. Each diode of the detector array is mated to a unit cell contained in the integrated circuit through a bump connection 601 assembled in a mechanical process. The resulting contact allows low parasitics and high-density detectors for desired applications.

Each unit cell contains a preamplifier 614 with active or passive feedback, gain stage 605, pulse shape processing circuits 606, a trigger event detector, comparator 607 and a peak height measuring circuit 609. A token readout circuit 611 also contained within the unit cell allows the readout of specific cells with recorded events for a fast detection event duty cycle. The output of the peak detector 610 goes into a tri-state analog buffer 610. The output 612 of the buffer 610 goes into a tri-state bus 615.

Each pixel contains electronics to detect and process a detection event associated with a single detector. Bond pads 305 are located on one side of the chip to accommodate multiple detectors in the same system, one sided wire bonding 311 and tight integration. This is forms a three sides abuttable pixel detector.

Using deep vias it is possible to bring the electronics inputs and outputs to the other side of the ASIC 304 so that a four sides abuttable pixel detector (FIG. 10) can be fabricated. In this case it will be important to integrate all the peripheral electronics, not used inside the pixels to be placed in the pixelated area so that the ASIC 304 area can be matched to the area of the solid state detector pixel array 301.

Each unit cell contains all the necessary electronics to sense, process, and readout events delivered from the attached detectors.

The imaging using the disclosed detectors can be done in different ways. The pixels can be read out in any desired sequence as the detector and/or the object moves. The detector moves to a new position stops and the pixels read out and the process is repeated. The pixel detector moves continuously and the pixels read out in columns using TDI technique in the TDI direction which is the reverse direction to the movement of the object or the detector. The detector is not moved and the images are read out in the staring array mode in any desired sequence of time intervals. The motion of the detector may need to be followed or matched by the photon or particle generator. The motion of the detector and/or the object may follow different type of paths.

Main Features:
- 256 channels or pixels 303 arranged in a 16×16 matrix at 500 um pitch. Other pixel ranges from <2×2 to >4,096×4,096 can be used.
- Self-resetting charge sensitive amplifiers 614. These amplifiers also have an active or passive feedback that includes a passive or dynamic resistor 603 and/or capacitance 604, and or a MosFET transistor feedback element.
- Count rate can range from 1 photon/sec/pixel to 1,000,000 photon/sec/pixel depending on the chip design. Therefore, maximum count rate can be above 400E3 photons/s for all channels in parallel.
- Gains and offsets of each channel are digitally adjustable.
- Input energy range <1 keV to >150 keV. Using thick detectors the input energy range can be >1,000 keV. This is true for both input polarities.
- Selectable shaper filter shaping time, <10 nsec to >40 usec in more than 16 steps for noise tradeoff versus detection rate selection.
- Data readout is controlled by a programmable token logic 611.
- Additional data read options are provided by an $\geq$8 bit data bus. The bus can be serial, or parallel. Number of bits depends on the design and is not limited.
- Multiple chips may be used in the same system by daisy-chaining up to 16 or more chips that share a common analog output. The outputs use tri-state buffers to avoid conflicts.
- A test signal input can be connected or routed to the detector inputs or pixel inputs 601 of any channel or combination of channels.
- An analog monitor output can be connected to any channel or pixel to display its analog signal. This system can look at the pre-amplifier 614, gain stage 605, and/or shaper amplifier 606 outputs selectively or all together. This is important for testing, characterization and calibration.
- The cell token logic 611 ensures that only one peak detect output is put on the analog bus at a time.
- Power consumption: 1500 mW nominal. Much lower power is possible <1 mW to >1500 mW.
- Input referred noise <200 e rms.
- Die size: $\approx 8.575 \times 9.535$ mm$^2$ sized to accommodate tight integration of multiple detectors. The die size depends on the pixel array size and the pixel pitch and has no other limitation then design and application requirements.
- Input pad spacing: 0.15 mm to allow 57 pads on one edge of the chip. Dual, triple or higher pad arrays can be made for I/O connections. Input pad size and dimensions has no limitations other than design considerations.
- Active low (internally pulled down) chip enable that allows for connecting the data busses of several IC's in parallel.
- All digital inputs and outputs are compatible with standard 3.3V logic (LV or LVDS). Different processes can be used to design and fabricated the chips. These designs may have different voltage requirements.

Sequence of Reading Out Events

The DANA chip contains logic for detection and readout of events. The following sequence of events characterizes the operation of the DANA chip.
1. The array is placed in detection mode waiting for an event
2. An event occurs: an analog level is triggered causing the wired-or trigger signal to assert
3. External logic, decides to either read out the array immediately or wait a predetermined amount of time for required detection purposes.
4. The predetermined readout operation is performed to collect the analog peak signals, with or without the nearest neighbors, or in some other predetermined pattern.
5. The array is then reset and the operation repeats to #1

The above sequence should be completed in a relatively short period of time so that as much as 500,000 loops can be completed per second under random pulse conditions. The control logic present within the unit cell was designed to try to achieve this fast frame rate and also maintain simplicity and ease of use.

Multiple Energy Digital Radiography

Figure 7:
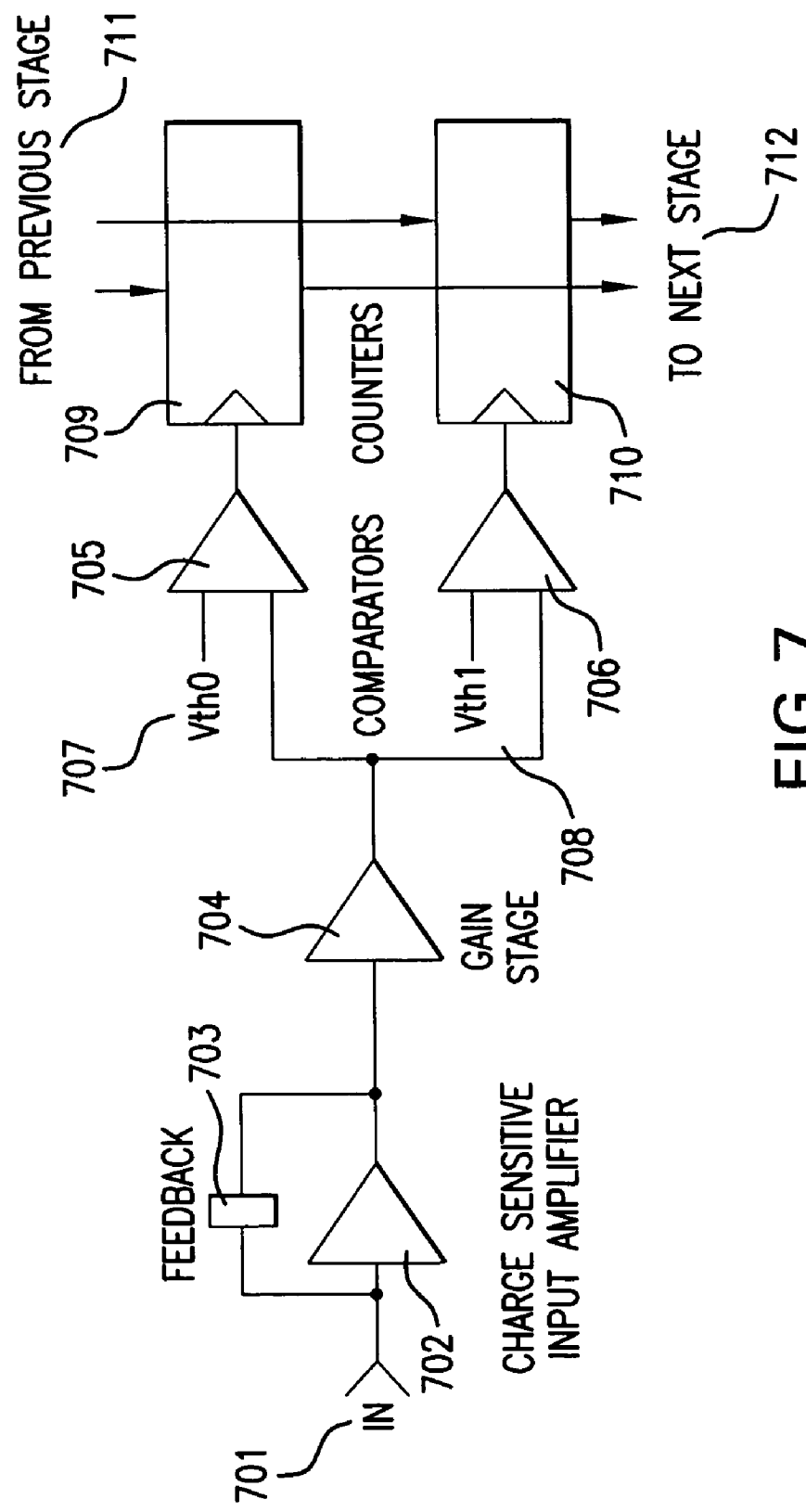
FIG. 7 is a top level diagram of a pixel with dual energy channels.

FIG. 7 shows the electronics used in one of the channels of a digital radiography system. The input comes from a detector pixel into the input 701 of each channel. The input can be also turned on and off so that the chip does not process any input signals until the inputs are turned on. The signal is then amplified by an amplifier 702, which is a charge sensitive type, it has feedback element 703, a gain stage 704 may be used, and the output of the amplifier and/or the gain stage goes to multiple comparators 705, 706 (two shown here). The comparators 705, 706 has thresholds 707, 708 controlled either by internal DACs or external circuitry, the outputs of the comparators 705, 706 goes to counters 709, 710, respectively. The counters are read out in sequence from previous stage 711 to next stage 712, or in parallel. The counters in different channels may also be linked in the same way for readout.

The digital radiography system (FIG. 7) may also be used as a multi energy imaging system. A comparator 705, 706 type electronics readout system can be used as described above to divide the incoming x-ray or gamma ray photons into different energy bins. The is number of photons in each energy bin is then counted 709, 710 separately and separate images are produced using the photon counts in different energy bins. The separation of the photons into separate energy bins can be done in different ways, such as using comparators as described above, pulse height information, overflow wells or capacitors, leaky wells or capacitors, transistor ladder, etc. The counting of the pulses from the detector pixels can be also done in different ways such as analog counters, digital counters, mixture of analog and digital counters, TDI for each energy bin, etc. If small sections of TDI are used such as N sections then the count rate at the beginning pixel of a TDI channel with total TDI counts of C will have C*(1/N) counts. The next channel will have C*(2/N), so on. Therefore, the digital or analog counters at the beginning of each TDI section will use a small number of bits. And more and more bit counters will be required as the TDI section progresses down the TDI direction. Since the counter sizes are different along the TDI section the larger counters can share the area under the small counter pixels to reduce the size of the pixels.

Figure 13:
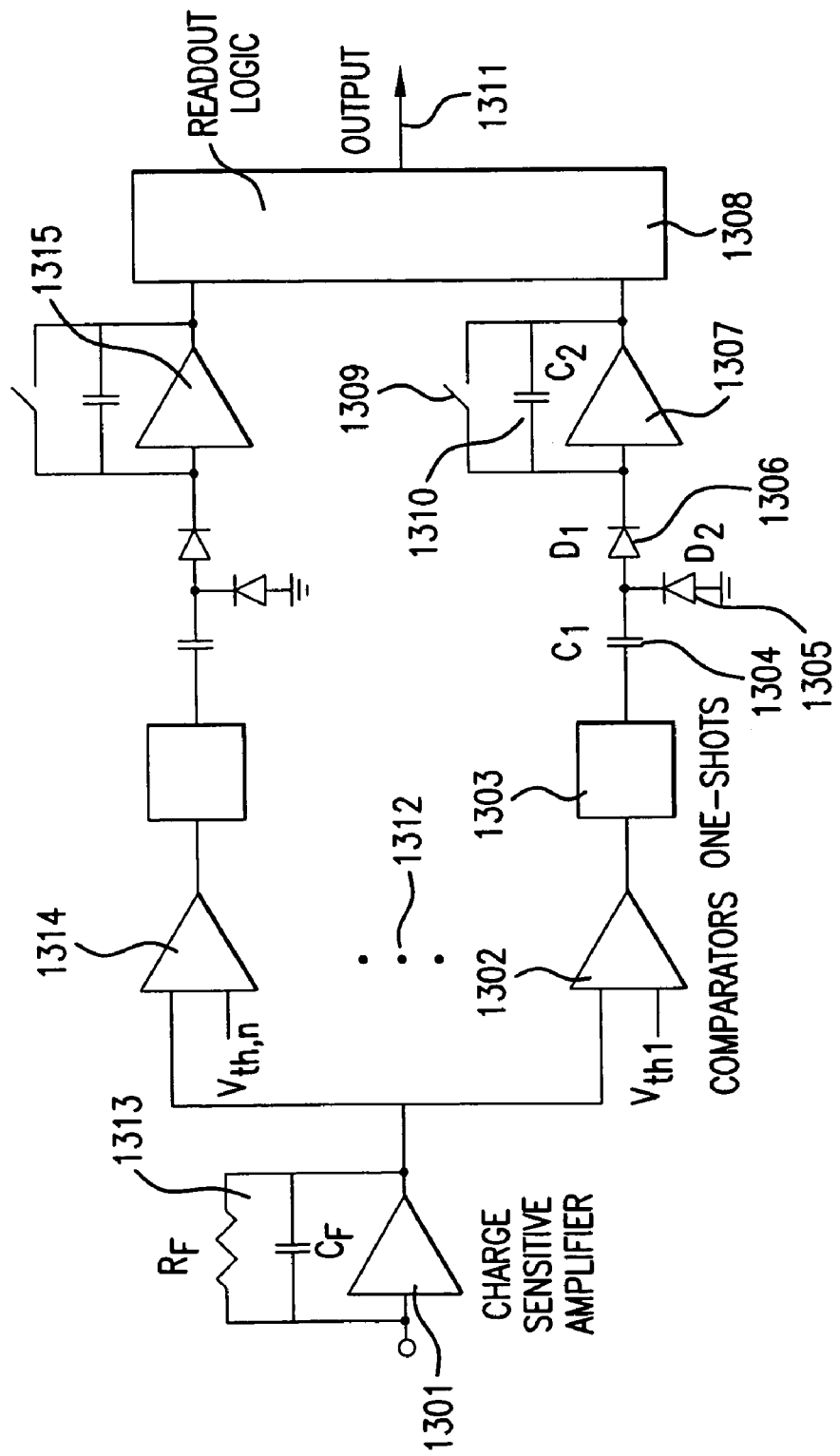
FIG. 13 is a block diagram showing a single channel of a chip which uses analog counters for accumulating multiple energy images.

The analog counter system is shown in FIG. 13. The charge-sensitive input amplifier 1301 of the cell shapes the charge pulse received at its input with the help of the feedback circuit 1313. This amplifier 1301 is followed by an optional gain stage, which is not shown. In order to determine the energy deposited by the photon, the charge pulse is then discriminated by a number of comparators 1302, 1312, 1314, each of which is set to a different threshold and has associated with it counter circuitry to determine the number of photons that exceed the threshold in a given time. When the comparator output goes high a one shot circuit 1303 produces a small positive pulse, which is used by the analog counter circuit proper. This circuit consists of a very simple single stage amplifier 1307 with a large capacitive feedback 1310. On the rising edge of the comparator pulse, charge flows through the diode D1 1306 and is integrated on the capacitor C2 1310. The capacitor current generated by the falling edge of the comparator pulse is blocked by D1 1306 and instead flows to ground through D2 1305, allowing C2 to accumulate a charge that is proportional to the number of pulses counted from each event. Periodically, the system will poll the results of the ASIC. After readout through Readout logic 1308, the array is reset and the timing is repeated. The readout system, after reading the lowest threshold counter result and find a very small value present, it may decide that there is no need to read the rest of the counters in that cell to save time.

We disclose a dual or multiple energy level detector system, using high uniformity CdZnTe or other comparable materials for digital mammography and radiography. Dual energy subtraction techniques offer an alternative approach to conventional mammogram images as they allow tissue images to be separated according to their intrinsic attenuation of x-rays. In this approach, high and low x-ray energy images can be acquired simultaneously without any delay and using the same detector array without spatial differences or variations, and the high and low energy images can be subtracted from each other in a weighted fashion. This technology also allows for multiple energy segmentations, which would be useful to make multiple energy separated images. Using this technique it may be possible, for example, to subtract the bones or certain kinds of tissue out of a radiogram to produce higher quality images.

The disclosed system would have DQE >85%, limiting resolution $\geqq 8$ lp/mm, ultra-low noise, linear response and high dynamic range of >15 bits. This system's detector is produced using a hybrid technology consisting of a converter layer in which high Z, high density photoconductive materials such as CdZnTe are used to achieve high x-ray quantum detection efficiency. The detector electronics are hybridized to a CdZnTe pixel array 301 to fabricate a CdZnTe pixel detector. Each incoming pulse is processed and separated based on its energy and then digitized and stored in a computer as an image matrix.

Dual energy radiography is a technique that is able to resolve tissue types, which vary in effective atomic number (effective Z) by acquiring two images, each at a different x-ray energy. Because tissues with substantially different effective Z's (i.e. soft tissues, fat tissue, dense tissue, calcific tissues or other contrast agents) demonstrate nonlinear energy dependencies in terms of x-ray attenuation, images acquired at two different energies allows the numerical elimination of one tissue type, resulting in more contrast of the remaining tissue type due to the elimination of structured noise. Dual energy x-ray mammography may be performed subsequent to the injection of an iodine-based x-ray contrast material. After some period of time (measured in minutes) two images at two different energies are acquired in rapid succession. These images are manipulated (using weighted logarithmic subtraction techniques performed pixel by pixel), but due to the slight time delay between the acquisition of the high and the low energy images, motion artifacts can occur. Motion artifacts can reduce the effectiveness of dual energy subtraction, and be a significant source of noise which can obscure the presence of lesions. Therefore, there is the need of an x-ray detector system, which is capable of simultaneous dual energy imaging capability which eliminates delays and motion artifacts.

An alternate single-shot technique for producing dual energy images of the breast is to use stacked detector systems, in which the detector immediately underneath the object detects the lower energy x-rays which pass through the object, and the second x-ray detector detects the higher energies because the lower x-ray photons have been filtered out by the first detector and by the placement of a metal foil between the two detectors. The problem with the sandwich detector approach is that a large number of x-ray photons, which have already passed through the object (and therefore contributed to radiation dose of the breast) are absorbed in the metal filter, which effectively wastes this radiation dose. The use of sandwich detectors is also known to be less effective in terms of energy separation, and thus images acquired in this fashion generally suffer from lower signal-to-noise ratios in the dual energy subtracted images. Since the two images are obtained by separate detectors and there are detector response variations and a magnification factor difference the two images may require image manipulation for accurate image subtraction. This invention eliminates the need for image manipulation and spatial variations and differences.

We disclose a system and method, which is capable of single-shot imaging (without motion artifacts and spatial differences between two exposures) with superb energy discrimination with externally adjustable threshold between the low and high energy images. It also combines the benefits of two-shot and one-shot dual energy imaging modalities with none of the compromises mentioned above.

A high uniformity CdZnTe (or other suitable material) detector with low leakage current is hybridized to an IC readout chip developed specifically for dual or multiple energy digital radiography, using a pulse processing, electronic energy separation, digital counting and Digital Time Delayed Integration (DTDI) technology.

Dual Energy Digital Mammography

Dual energy digital radiography is a subtraction technique based on different attenuation characteristics of soft tissue and calcifications. Dual energy mammography can provide an alternative approach to the visualization of micro calcifications or other contrast agents, which are the key features for identification of breast cancer. With this technology, high and low energy x-ray images are acquired and subtracted with weight so that the background image clutter from other tissue structures such as ducts, vessels and soft masses are suppressed so that the region of interests can be better identified. The direct conversion detector system, which is composed of a high-Z, high efficiency x-ray absorption layer integrated onto an IC signal-processing chip where each charge pulse converted from incoming an x-ray photon is amplified, shaped, energy segmented and counted for. FIG. 3 shows the schematic drawing of a direct conversion detector and how it is connected to a readout chip through the indium bump 302 bonding technology.

We use a photon counting technique with a digital counter architecture, which is different from our present MARY readout IC, which uses a current integrating and CCD based charge transport architecture to achieve Time Delayed Integration (TDI). TDI technology, compared to flat panel technology, has the advantage of averaging contributions from many other pixels in the scanning direction (192 in our MARY chip) and therefore, can tolerate more bad pixels than the flat panel case. In FIG. 7 a top level schematic diagram of a single pixel cell of the chip with dual energy channels and digital counters 709, 710 is shown.

Figure 3B:
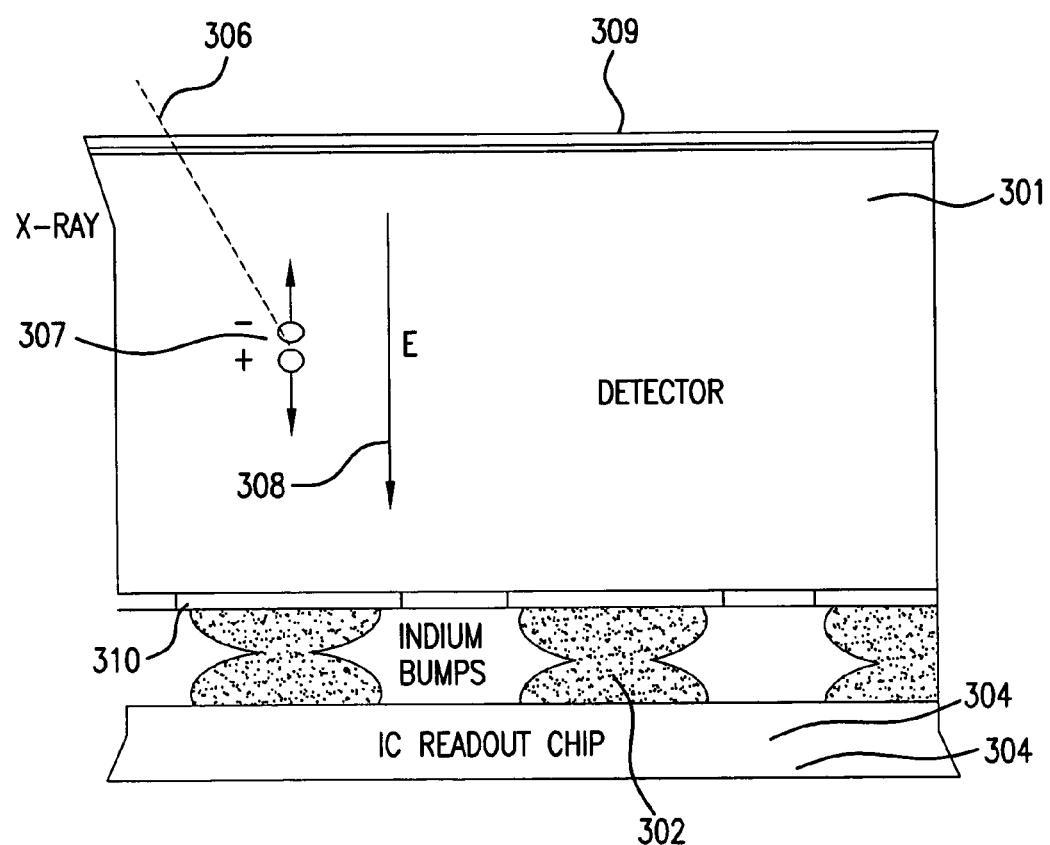
Figure 4:
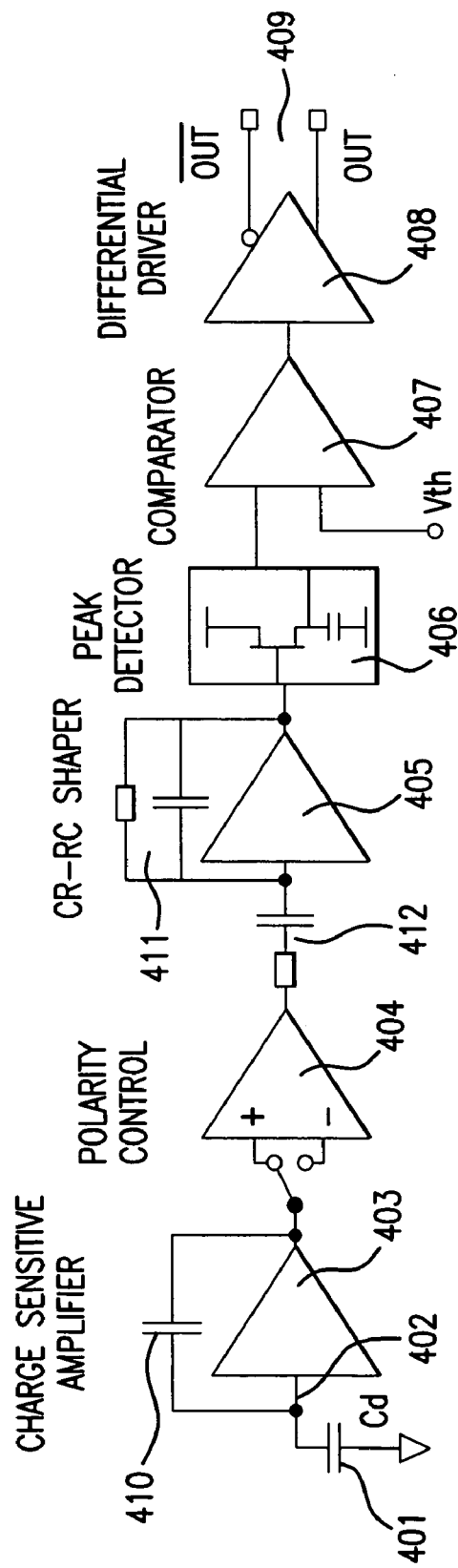
FIG. 4 is a drawing of the Schematic of the ASIC per-pixel front-end analog chain.

When an x-ray photon is captured by a solid state detector 301, a charge bundle 307 is generated. The charge bundle moves under the effect of the bias voltage 308 applied between the anode 309 and the cathode pixels 310. The field may also be reversed so that cathode 309 can be on the top and anode will be the pixels 310. In a CdZnTe detector normally electrons are collected but alternatively holes could be collected, too. Therefore, the anode is normally pixilated with same pixel array geometry as the readout chip. The cathode is normally a single electrode where a negative voltage is applied as the bias (this is opposite to what is shown in FIG. 3B). When the electrons reach the anode they produce a tiny charge pulse. The number of electrons in the pulse is directly proportional to the energy of the incident x-ray photon. This pulse is then coupled to the pixel cell of the readout chip through the indium bump bond 302. The charge-sensitive input amplifier 702 of the cell integrates and also shapes this pulse through the use of a feedback circuit 703 with the right frequency response and low noise in order to successfully detect the size of the charge packet. The height of the shaped pulse is directly proportional to the number of electrons and/or holes in the pulse and, therefore, also directly proportional to the energy of the incident x-ray photon. Therefore, the x-ray photons with different energies can be discriminated and counted if the height of the pulse is selected or determined. The input amplifier 702 is followed by an optional gain stage 704. In order to determine the energy deposited by the photon, the charge pulse is then discriminated by a number of is comparators 705, 706, each of which is set to a different threshold and has counter circuitry 709, 710 to accumulate the number of photons that exceed the threshold in a given time.

The DTDI circuit will be achieved by transferring the counts from pixel to pixel rather than charge as is done in the present MARY chip. A readout logic circuit controls the DTDI circuit. In DTDI mode, the counts in each counter is passed to its neighboring cell in the opposite direction to the scanning motion, and only the counts in the last cell of the DTDI chain is read out. The TDI concept for charge transfer systems is described above.

We are using a slot-scanning technique, which is different from a flat-panel approach. However, using these chips in the staring array mode a panel type detector can be fabricated to image the object without scanning similar to a flat-panel detector. To do this a 2D abutted array of pixel detectors will be fabricated.

Tomography and Stereoscopic Imaging

These detector systems can also be used to produce tomographic imaging by rotating it around the object or the patient. The rotation can be helical or spiral. Or two detector systems can be used at right angles to obtain images in orthogonal directions. Another possible mode is to use three detector systems to cover the three sides of the object under investigation. Or four or more detectors can be used to cover all sides of the object. This is another way of obtaining tomographic images. In this mode the rotation may not be necessary or may be limited to an arc. One or more x-ray generators may be used for these modes of operation. Another possible mode of application can be scanning in the direction of two visual angles using two detectors viewed buy two x-ray sources. If the visual angles are set correctly a stereoscopic images can be produced of the object or the patient under investigation. Many different variations on positioning the detector systems, scanning and obtaining different types of images are possible.

Preamplifier, Shaper and Discriminator Stages

The input amplifier 702 consists of a common cascade single ended preamplifier stage with a continuous-reset capacitive feedback. This cell provides high gain and will be optimized to match the input capacitance of the detector pixel. It also contains a test input circuit, which is used only for testing and characterization purposes.

A DC feedback 703 current proportional to the output pulse height is provided by a linearized trans-conductor circuit typically used for $g_m$-C filters. This provides the DC feedback 703 current at a rate proportional to the preamplifier output. In effect, it acts like a resistor but is referenced to an externally supplied reference voltage. An external current input is used to control the ratio of feedback current and thus the input amplifier time constant.

The preamplifier is followed by a gain stage with programmable gain and offset. It provides voltage gain from a factor of about <4 to up to about >20. It is selectable through control of three bits of programmability in each cell. The large feedback resistor value is available in a 0.35 micron process through the use of a high resistive poly option providing 1.2 kOhm/square. The baseline level at the amplifier output can be adjusted via a six-bit offset DAC. The gain stage may be omitted if necessary to reduce pixel area by careful design of the preamplifier so that it incorporates the gain stage.

Disclosed unit cell block diagram (FIG. 7) is showing all the required blocks except the offset adjustment circuit which is a part of the gain stage. The offset adjustment circuit may not be required if the signal path is capacitively coupled or the comparators are designed to have built in offset adjustment circuitry.

One embodiment uses a CMOS-inverter based high-speed comparator. The threshold of a CMOS-inverter based comparator needs to be set dynamically, but this can be accommodated by inserting a small time gap between the count gate intervals used for successive image frames. The benefit is a comparator of very high speed and very small circuit area.

Digital Counter and DTDI Readout

The digital counter 709, 710 is made small due to a flip-flop circuit design created specifically for use in a ripple carry counter configuration. This flip flop circuit contains a minimum number of transistors and is configured as a simple master slave circuit configuration. However, in this configuration, the slave latch is also able to drive the master latch of the next stage even though both latches are identical. This produces a compact design. Advantages of the new counter design are listed below.

1. Requires a small number of transistors while still retaining required functionality including the reset function and the readout function. This is important to fabricate pixel detectors with small pixel area or pitch.
2. Can be arrayed easily due to the symmetrical use of the master and slave latches in the flip-flop circuit. When the counter bit circuits are arrayed in a ripple carry adder, the master latch drives the slave latch while the slave latch drives the master latch of the second counter bit. This is accomplished by creating a counter flip-flop that has a high impedance input for both the master and slave latches and has a low impedance output for both master and slave latches as well. A standard flip-flop circuit has buffer stages at the output to solve this problem but this solution is non-symmetrical, non-differential, power hungry, and requires more circuit area.
3. This circuit is differential. This improves noise performance of the readout circuit as a whole due to the decrease in transients within the array caused by the differential circuits used therein.

Figure 8:
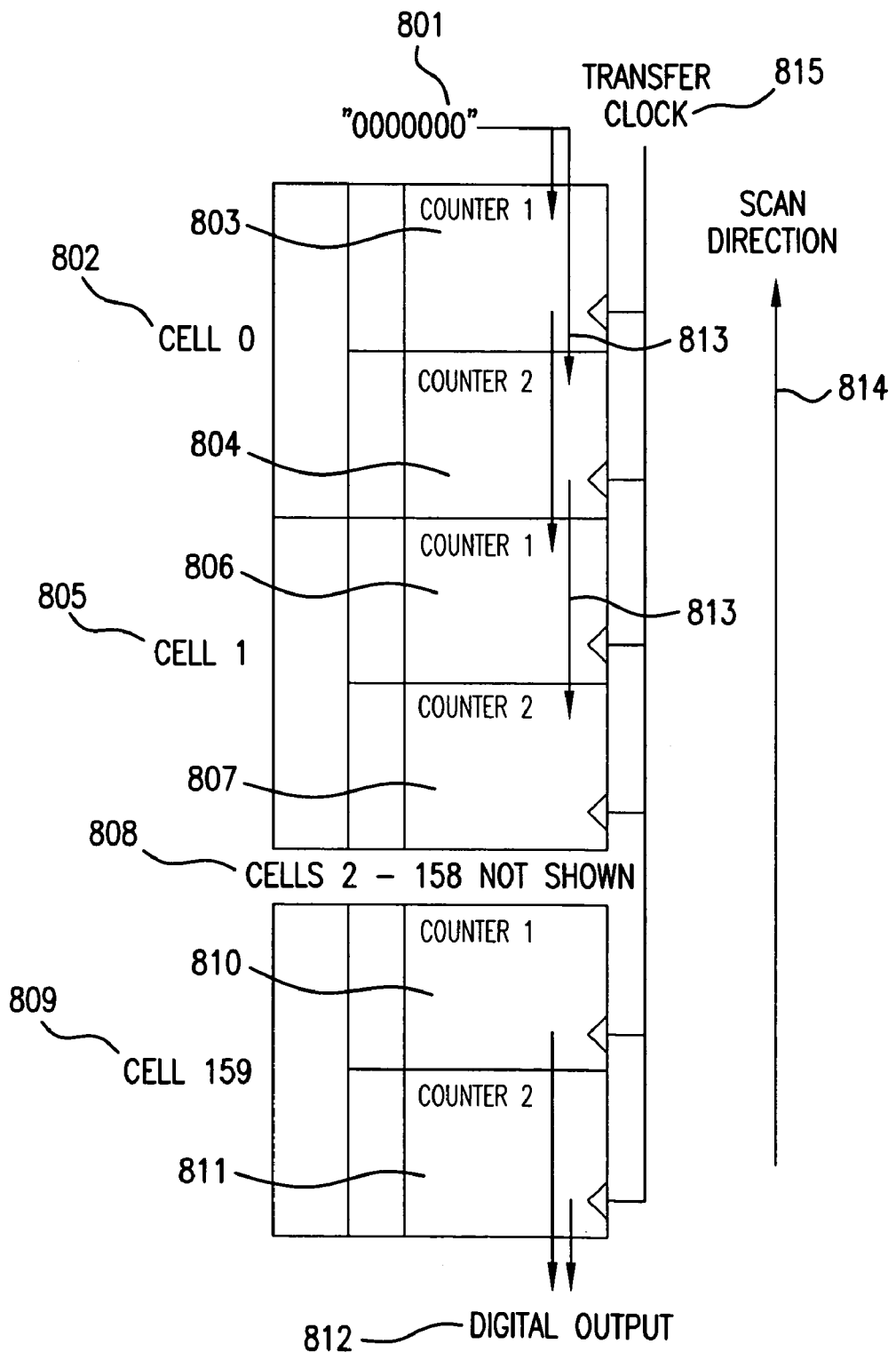
FIG. 8 is a block diagram of a 160 cell DTDI circuit with two counters in each cell.
Figure 9:
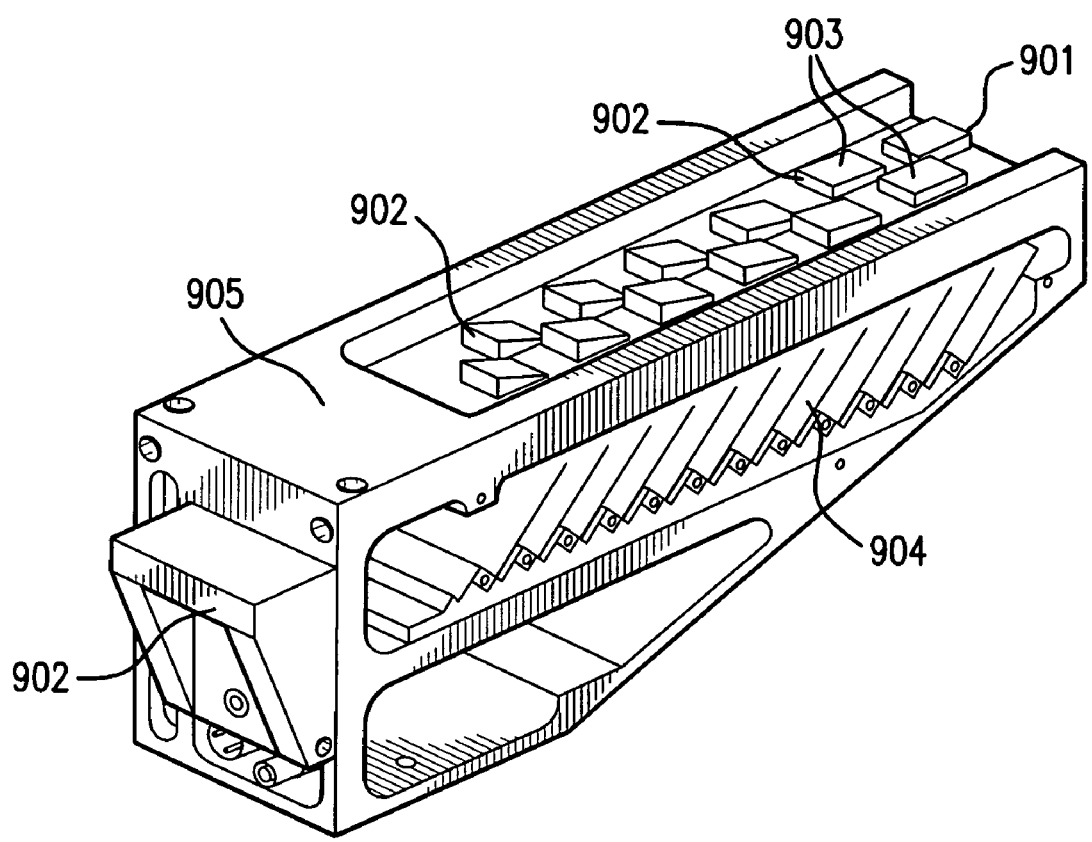
FIG. 9 is a drawing of the staggered linear array formation with tilted detector normal to the x-ray beam direction.

FIG. 8 is a block diagram of a 160 cell DTDI circuit with two counters in each cell. There is no limitation on the number of cells and/or comparators and/or counters per cell. Therefore, same design can be extended to include more than 2 counters per pixel or channel. In Cell 0 802 the counter 1 803 and the counter 2 804 starts with 0 counts 801. Counter 1 803 counts the lower energy x-ray photons and the Counter 2 804 the higher energy ones. The counters increment every time an event is observed or the input pulse causes the comparator to fire or turn on. In DTDI mode Counter 1 803 in each cell is transferred in opposite direction 813 to the scan direction 814 into the Counter 1 806 of the adjacent cell 1 805 by the use of the transfer clock 815. Counter 2 804 is also transferred similarly into the Counter 2 807 of the neighboring cell by the use of the transfer clock 815. The two counters may have separate transfer clocks. This process continues through all the following 2-158 channels 808 and comes out from the last cell or channel 159 809 counter 1 810 and counter 2 811 at the outputs 812. This system works without a need to have an adder circuit because when the counts accumulated is transferred from cell 1 802 Counter 1 803 to next cell's counter 1 it already contains the counts from the first cell. Therefore, when the counts are in the second cell's counter 1 806 this counter starts counting from the counts accumulated inside counter 803. Therefore, in this embodiment just transferring counts in sequence in the TDI direction 813 opposite to the scan direction 814 is sufficient to produce a natural DTDI process with minimum electronics to achieve small pixel size.

In another embodiment counter 1 803 and counter 2 804 in cell 0 802 start with the maximum counts and each event decrements the counters. Then the counters are transferred to adjacent cell's counters similarly. This allows the possibility of using the opposite polarity signal or charge from the detector using the same pixel detector and the ASIC. Since the counters are digital and the noise and background signals are discriminated, this mode will be as accurate as the incrementing system described above.

In a previous CCD based MARY readout chip, an 8 stage TDI architecture was applied and summed up all the output signals off the chip to achieve a total of 192 stages of charge integration in the scanning direction. Limiting the TDI to 8 channels was due to the fact that each x-ray photon producing several thousand electrons is a strong signal unprecedented in the scintillator based detectors. Therefore, CCD well size could not be made large enough within the 50×50 micron$^2$ pixel area to accommodate so much charge. The 8 channel TDI required extra peripheral electronics outside the chip to multiplex, sum, transfer, digitize, etc.

The use of the DTDI technique eliminates most of these problems. For example, a longer DTDI architecture can be used reaching up to the whole DTDI length of $\leq 192$ channels or much more. This can be achieved because a counter is used. If the total counts at the end of DTDI is over 16 bits then we have several options: 1. Increase the counters to 17 bit or higher, 2. Drop least significant bits, and/or 3. Use small number of bit counters at the beginning cells and larger counters in the pixels at the end of the DTDI chain. The last option is possible because the beginning of the DTDI chain always have low counts and much smaller counters such as 8 to 10 bit can be used for the pixels at the beginning of the DTDI architecture. This will produce empty area under these pixels. This extra real estate can be used for larger counters such as 18 to 24 bit or more towards the end of the DTDI chain, thus keeping the pixel pitch small, same size and periodic. The DTDI circuitry will allow long DTDI chain reducing multiplexing and summing, and eliminating digitization because it produced an already digitized digital signal. This will reduce the peripheral electronics, system size and cost.

In the case where the counters start with the maximum count and events decrement the counters as described above, the beginning pixel counters need to have the larger bit counters instead of the smallest and the smallest bit counters instead of the largest at the end of the DTDI chain.

Compared to Thin Film Transistor (TFT) technologies used in flat-panel approaches, CMOS technology allows the implementation of sophisticated circuitry inside the pixel area. Therefore, interesting new designs can be implemented using CMOS technology and/or some or most of the peripheral electronics needed outside the ASIC can also be incorporated onto the ASIC. Thus it is possible to reduce the area and the size of the circuits and the detector array by such careful and innovative design and also using finer foundry processes.

A properly selected detector thickness is essential for highest conversion efficiency and lowest noise or charge sharing among neighboring pixels. Compared to other solid detector materials such as Silicon (Z=14), Se (Z=34) and GaAs (Z=31, 33), CdZnTe (Z=48, 30, 52) has much higher Z in average and therefore, will attenuate much more higher energy x-rays than those lower Z materials do. For CdZnTe, each 20 keV x-ray photon produces about $4.5 \times 10^3$ electron-hole pairs, and detectors of thickness 0.2 mm and 0.5 mm will stop 95% and 99.8% of the 20 keV x-rays respectively. Each 50 keV x-ray photon produces about $1.1 \times 10^4$ electron-hole pairs and a 1.5 mm thick detector will stop 99.8% of the x-rays and therefore, high efficiency or high DQE is achievable. In our contrast imaging application, for example, we may concentrate the x-ray energy around 33.2 keV, which is the k-edge of iodine, as it has absorptions drastically different before and after this edge. A proper energy separation at this edge will give best contrast improvements for iodine based dual energy imaging.

The charge spread among neighboring pixels should not be a problem for our direct conversion detectors, as the electric field established between the electrodes will naturally focus the charge motion toward the pixel pad. For other detectors, such as the scintillators, the light photons generated by incident x-ray photons will propagate in all directions and thus causing low DQEs. In our previous study on digital mammography, we found that we could focus the signal charge to 0.05 mm pixels from a 2 mm thick detector without spreading to neighboring pixels.

This system has potential for other medical applications such as chest radiography and other suitable radiography by using thicker detectors, where the bone shadows from the x-ray can be removed so that better pulmonary nodule images are obtained. The prostate imaging is another area that this dual energy approach can help to remove the blocking bone shadows. It can also be applied to arthritis joint examination, bone densitometry and specialized medical radiology for a scanning type system. It may also be possible to distinguish different tissue types such as fat, muscle, liver, cancer tissues and image them with higher resolution using dual or multiple energy imaging.

These detectors can also be used for industrial imaging that require ultra high resolution inspection of high tech products and safety-critical applications, such as security, inspection of critical aircraft parts, corrosion and micro-fractures in aging aircraft, and NDE and NDI of critical high tech military, industrial and commercial products. It can be used to build very high resolution baggage scanners where the finest detail of the explosives such as sheet explosives, wires etc. And contraband can be seen clearly. This will help in the identification process.

In another embodiment we can produce a staring array using the same chip without changes. In the staring array mode, which is also discussed in detail above, the pixel detector ASIC observes single, dual or multiple energy images without scanning or any motion. This mode of operation can be achieved by turning on the inputs, accumulating an image, then turning off inputs and reading out the counters as fast as possible in the same way it is described above.

This process can be repeated as many times as needed to get high quality and high statistics images. However, the external circuitry needs to store the contents of each counter separately as they come out of the chip to form the image.

These pixel detectors can be formed into many different forms such as linear abutted arrays, linear staggered arrays, curved arrays of any form, flat or curved 2D flat arrays, etc. The arrays can also be put on top of each other to form 3D detector array structures.

Those having ordinary skill in the relevant art will appreciate the advantages provided by the features of the present disclosure. In the foregoing Detailed Description, various features of the present disclosure are grouped together in a single embodiment for the purpose of streamlining the disclosure. This method of disclosure is not to be interpreted as reflecting an intention that the claimed disclosure requires more features than are expressly recited in each claim. Rather, as the following claims reflect, inventive aspects lie in less than all features of a single foregoing disclosed embodiment. Thus, the following claims are hereby incorporated into this Detailed Description of the Disclosure by this reference, with each claim standing on its own as a separate embodiment of the present disclosure.

It is to be understood that the above-described arrangements are only illustrative of the application of the principles of the present disclosure. Numerous modifications and alternative arrangements may be devised by those skilled in the art without departing from the spirit and scope of the present disclosure and the appended claims are intended to cover such modifications and arrangements. Thus, while the present disclosure has been shown in the drawings and described above with particularity and detail, it will be apparent to those of ordinary skill in the art that numerous modifications, including, but not limited to, variations in size, materials, shape, form, function and manner of operation, assembly and use may be made without departing from the principles and concepts set forth herein.

Fast Counting Imaging System

The pixel detectors and their readout chips can run in fast mode for acquiring fast images. This is done with the circuits shown in FIG. 7 and FIG. 13. In these cases the energy bins are separated simultaneously by the comparators 705, 706, 1302, 1312, 1314 and the output of each comparator is counted by digital counters 709, 710 and analog counters 1307, 1315. Therefore, each channel or pixel accumulates multi energy data simultaneously without intervention from external circuitry and/or software. Also each channel or pixel is completely independent of each other and accumulate data simultaneously without any dead time. This data can also be collected in real time. After the data accumulation the counting is stopped and the counts in each counter in the ASIC are readout in parallel and/or in series as fast as possible to reduce delay. The counters are then reset and the data accumulation can start again. To reduce the delay to practically zero, the counts inside the counter can be shifted into a register, counters reset and the counting can start immediately. The contents of the registers are than read out while the pixel detector is counting the incident x-ray photons. The cycle can be repeated as many times as necessary.

Imaging Emitted Radiation

On top of the pixel detectors and arrays a collimator can be used to produce images of x-rays or gamma rays emitted by objects. Since these photons can be emitted from anywhere inside or surface of the object the photons does not follow well defined paths such as generated by x-ray generators. Therefore, a collimator will be necessary so that each pixel images photons coming from a certain area on or inside the object emitting radiation. A collimator with size, thickness, dimensions and geometry required for a specific application can be placed on top the same detector systems disclosed above. Images are also produced same way as described. The collimator separates the particles, x-rays and gamma rays to specific angles, which produces the image of the object under investigation. The detectors developed in this embodiment may be used for applications such as security (detecting radioactive material and radioisotopes), gamma camera and SPECT (single photon emission tomography) for medical imaging.

High Energy Imaging System

In another embodiment the two positron annihilation photons with energy of 511 keV can be detected in or out of coincidence for positron emission tomography (PET). This embodiment may also be used for other high energy photon detections for energies reaching above 1,000 keV. The fast trigger system required for the coincident detection as discussed above. Compton scattering dominates for CdZnTe detectors above 250 keV. This means that the gamma ray most likely makes more than one interaction inside the CdZnTe volume. At this energy level about three quarter of the incident gamma rays undergo a Compton scatter. These interactions can be detected, energy deposition determined and results used to reconstruct the direction and energy of the incident gamma ray. In PET application since the two simultaneous gamma rays produced back-to-back are detected the direction measurement may not be necessary. However, it will be important to determine the first interaction position so that the path of the two simultaneous gamma rays can be determined to construct the image.

Because the effective Z of CdZnTe is about 50 the quantum efficiency is not as large as the typical PET scintillators (BGO and LSO) and large thickness CdZnTe detectors are required. Or higher Z solid state detector such as $PbI_2$ may be used. This system can also be used to fabricate small animal imagers for the field of molecular imaging. Because the area of coverage for a small animal is relatively small, one can create a lower cost system with large solid angle coverage. A large solid angle improves the sensitivity and ameliorates the low quantum efficiency. If the CdZnTe detectors are developed for high resolution human PET imaging, the detector layering or long CdZnTe detectors or higher Z solid state detectors or higher Z scintillators can be used.

Figure 12:
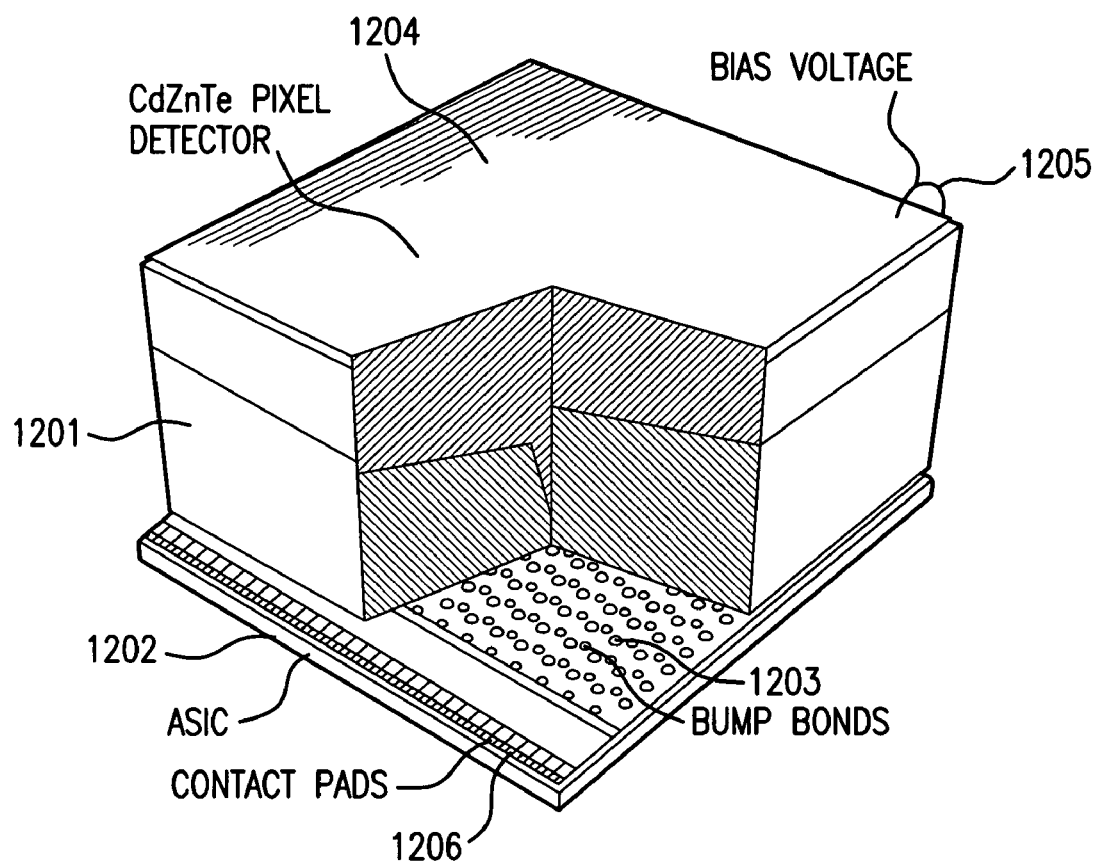
FIG. 12 is a block diagram showing a thick solid state pixel detector for high energy photon detection and imaging.

FIG. 12 shows a diagram of a high energy imaging detector as discussed above. The main features of this detector are:

1. The front-end readout electronics is designed onto the chip 1202. The CdZnTe pixel detector array 1201 is mounted on top of the ASIC 1202 as shown in FIG. 12, using a bump bond technology. The bias voltage 1205 is applied onto the top electrode 1204.

2. The input pad 1203 at each pixel on the ASIC will be connected directly to the pixel pad of the CdZnTe detector through a bump bond. This will have small connection capacitance, <1 pF. The separation of the bump bonds 1203 will be the same as the pixel pitch and thus larger than the typical pitch of the wire-bond pads 1206 used. This reduces the input capacitance and the chip will see only the true detector pixel capacitance, which is small, <1 pF for a pixel detector with thickness greater than 5 mm.

3. The peripheral electronics required for the data acquisition, analysis and signal generation is miniaturized to fit onto a small PCB.

4. Since the new pixel detectors can be mounted at nearly touching distance to each other, it is possible to make an array from 2 detectors up to any size one-, two- or three-dimensional arrays to increase the sensitivity and efficiency. This is especially important for detecting gamma rays with high energy, >500 keV, because at such high energies a large fraction of the gamma rays pass through a 1 cm thick CdZnTe crystal without an interaction or make one or even two interactions and then escape from the crystal without depositing all of their energy. To solve this issue there are two options: 1. Significantly increase the detector volume, which is costly; or 2. Mount several detectors in an array so that the escaping gamma rays can be captured at the adjacent detectors. Thus the abuttable pixel detectors are good candidates for the second and more cost-effective solution. This option also makes the CdZnTe pixel detectors modular, allowing the development of radiation detectors of any size, geometry, thickness and volume with a variety of sensitivities and efficiencies without loss of performance.

5. The ASIC and the readout electronics can be designed for low power consumption so that compact, portable and battery operated radiation detection equipment can be developed.

6. This pixel detector will have low energy threshold <20 keV. This is because of the small detector capacitance and the low noise ASIC. The small pixel effect will also play an important role in improving the energy resolution. We expect an energy resolution of about 0.5% to 0.8% FWHM @ 662 keV for single pixel events and a threshold of ≈10 keV. Lower noise will also improve the energy resolution of two- (or more-) pixel events.

7. The e-h pairs created is directed into columnar motion under the applied bias voltage, which allows excellent spatial resolution in the determination of the photon interaction point (s). Normally a photon will be absorbed by the photoelectric effect (PE). If a photon makes one or more Compton scatters inside the detector each interaction will produce a signal at the corresponding pixel.

8. The pixel detector provides additional modes of operation beyond a high energy resolution gamma ray detector. The x and y coordinates of each absorption or Compton scatter event inside the pixel detector will be known by determining the x and y coordinates of the pixel(s) that have detected an interaction. The z coordinate of each interaction can also be determined by either by pulse height ratio between anode and cathode signals (good for single interaction events) or by arrival time difference of each pixel signal if photon makes more than one interaction. Since the x, y, and z coordinates of each Compton interaction and the final PE absorption are known, it is possible to calculate the direction of the incident gamma rays using the Compton scatter formula through overlapping Compton scatter cones. The overlapping cones produce an image showing where the gamma rays are coming from. Determination of the incident gamma ray direction can open the potential for new applications for the pixel detector.

9. Due to its spatial resolution, the new pixel detector also allows gamma ray imaging by placing a collimator in front of the detector(s). The collimator may be of any kind, such as pin hole, parallel, cone beam, or slot type.

10. The efficiency can be further improved for high-energy gamma rays >500 keV if they undergo three or more Compton scatters. In this case, even if the scattered gamma ray escapes the detector(s), the energy of the incident photon can be determined at somewhat lower resolution by using the Compton formula. This will increase the efficiency for detection of high-energy gamma rays in small volume detectors.

11. This pixel detector can also be made to have single or multiple energy ranges so that it can extend from low energies to large energies. The multiple energy ranges make the pixel detector to have good energy resolution and accuracy in each range. The multiple energy ranges can be selectable. However, if the photon source used has a large energy range than the detector cannot be used effectively as selection of one of the ranges will be required. To overcome this we can use a system that automatically switches the energy range of the chip to the range of the incident photon.

What is claimed is:

1. A method for producing a plurality of images, comprising the steps of:
   using at least one source of radiation;
   constructing at least one position sensitive direct conversion detector;
   producing at least one charge signal from at least one portion of radiation emitted from said at least one source of radiation in said at least one position sensitive direct conversion detector;
   coupling at least one integrated circuit to said at least one position sensitive direct conversion detector, wherein said at least one integrated circuit produces at least one signal from said at least one charge signal;
   directing said at least one source of radiation to said at least one position sensitive direct conversion detector;
   placing at least one object between said at least one source of radiation and said at least one position sensitive direct conversion detector;
   scanning at least one portion of said at least one object by said at least one position sensitive direct conversion detector; and
   producing a plurality of images simultaneously for each scan of said at least one portion of said at least one object, wherein each of the plurality of images corresponds to a different depth within said at least one portion of said at least one object, wherein at least two of said plurality of images are produced for different energy ranges.

2. The method for producing the plurality of images of claim 1, wherein said at least one position sensitive direct conversion detector has a plurality of pixels.

3. The method for producing the plurality of images of claim 2, wherein said at least one signal is transferred from pixel to pixel within said plurality of pixels timed to a scan speed of said at least one position sensitive direct conversion detector.

4. The method for producing the plurality of images of claim 3, wherein said at least one charge signal is accumulated across at least one column of pixels in the opposite direction of said scan motion and output at least at one position of said at least one column of pixels.

5. The method for producing the plurality of images of claim 1, wherein said at least one portion of radiation emitted from said at least one source of radiation is selected from the group consisting of positrons, electrons and photons.

6. The method for producing the plurality of images of claim 1, wherein said at least one position sensitive direct conversion detector is made to form an abuttable design wherein the abuttable design is selected from the group consisting of two-side abuttable, three-side abuttable and four-side abuttable design.

7. The method for producing the plurality of images of claim 1, wherein said at least one charge signal is accumulated over a plurality sections of said at least one position sensitive direct conversion detector using said at least one integrated circuit and output at multiple points across said at least one position sensitive direct conversion detector using said at least one integrated circuit.

8. The method for producing the plurality of images of claim 1, wherein said at least one integrated circuit is disposed under said at least one position sensitive direct conversion detector.

9. The method for producing the plurality of images of claim 8, wherein at least one mounting board is disposed in between said at least one integrated circuit and said at least one position sensitive direct conversion detector.

10. The method for producing the plurality of images of claim 1, wherein said at least one signal is at least one count signal used to produce said at least one image.

11. The method for producing the plurality of images of claim 10, wherein said at least one count signal is used to produce at least two images for different energy ranges.

12. The method for producing the plurality of images of claim 1, wherein TDI technique is used.

13. The method of claim 1, further comprising sequentially reading out alternating pixels of the detector, wherein scanning said at least one object is performed linearly.

14. The method of claim 1, further comprising:
   rotating said at least one position sensitive direct conversion detector; and
   rotating said at least one source of radiation.

15. A method for producing at least two images, comprising the steps of:
   using at least one source of radiation;
   constructing at least one four-side abuttable position sensitive direct conversion detector;
   producing at least one charge signal from at least one portion of radiation emitted from said at least one source of radiation in said at least one position sensitive direct conversion detector;
   coupling at least one integrated circuit disposed under said at least one position sensitive direct conversion detector, wherein said at least one integrated circuit produces at least one signal from said at least one charge signal and wherein said at least one integrated circuit is a mixed signal integrated circuit having at least one analog circuit and at least one digital circuit;
   directing said at least one source of radiation to said at least one position sensitive direct conversion detector;
   placing at least one object between said at least one source of radiation and said at least one position sensitive direct conversion detector;
   processing said at least one signal; and
   producing at least two images of at least one portion of said at least one object, wherein at least two of said at least two of images are produced for different energy ranges.

16. The method for producing the at least one image of claim 15, wherein said at least one position sensitive direct conversion detector has a plurality of pixels.

17. The method for producing the at least one image of claim 16, wherein said at least one signal is transferred from pixel to pixel within said plurality of pixels.

18. The method for producing the at least one image of claim 17, wherein said at least one charge signal is accumulated across at least one column of.

19. The method for producing the at least one image of claim 15, wherein said at least one portion of radiation emitted from said at least one source of radiation is selected from the group consisting of positrons, electrons and photons.

20. The method for producing the at least one image of claim 15, wherein said at least one four-side abuttable position sensitive direct conversion detector comprises at least two four-side abuttable position sensitive direct conversation detectors positioned to abut one another.

21. The method for producing the at least one image of claim 15, wherein said at least one charge signal is accumulated over a plurality sections of said at least one position sensitive direct conversion detector using said at least one integrated circuit and output at multiple points across said at least one position sensitive direct conversion detector using said at least one integrated circuit.

22. The method for producing the at least one image of claim 15, wherein said at least one image consists of a plurality of images, wherein each image corresponds to a different depth within said at least one object.

23. The method for producing the at least one image of claim 15, wherein said at least one signal is at least one count signal used to produce said at least one image.

24. The method for producing the at least one image of claim 23, wherein said at least one count signal used to produce at least two images for different energy ranges.

25. The method for producing the at least one image of claim 15, wherein TDI technique is used.

26. The method for producing at least one image of claim 15, wherein at least one mounting board is disposed in between said at least one integrated circuit and said at least one position sensitive direct conversion detector.

27. An imaging system comprising in combination:
   at least one source of radiation;
   at least one position sensitive direct conversion detector, wherein said at least one position sensitive direct conversion detector produces at least one charge signal from at least one portion of radiation emitted from said at least one source of radiation and wherein said at least one source of radiation is directed to said at least one position sensitive direct conversion detector;
   at least one integrated circuit coupled to said at least one position sensitive direct conversion detector, wherein said at least one integrated circuit produces at least one signal from said at least one charge signal;
   at least one object placed between said at least one source of radiation and said at least one position sensitive direct conversion detector, wherein said at least one position sensitive direct conversion detector scans said at least one object;
   at least one processing system responsive to said at least one signal; and
   said at least one processing system processes said at least one signal to produce simultaneously at least two images for each scan of at least one portion of said at least one object, wherein each of said at least two images correspond to a different depth within said at least one portion of said at least one object, wherein at least two of said at least two of images are produced for different energy ranges.

28. The imaging system of claim 27, wherein said at least one position sensitive direct conversion detector has a plurality of pixels.

29. The imaging system of claim 28, wherein said at least one signal is transferred from pixel to pixel within said plurality of pixels timed to a scan speed of said at least one position sensitive direct conversion detector.

30. The imaging system of claim 29, wherein said at least one charge signal is accumulated across at least one column of pixels in the opposite direction of said scan motion and output at least at one position of said at least one column of pixels.

31. The imaging system of claim 27, wherein said at least one portion of radiation emitted from said at least one source of radiation is selected from the group consisting of positions, electrons and photons.

32. The imaging system of claim 27, wherein said at least one position sensitive direct conversion detector is made to form an abuttable design wherein the abuttable design is selected from the group consisting of two-side abuttable, three-side abuttable and four-side abuttable design.

33. The imaging system of claim 27, wherein said at least one charge signal is accumulated over a plurality sections of said at least one position sensitive direct conversion detector using said at least one integrated circuit and output at multiple points across said at least one position sensitive direct conversion detector using said at least one integrated circuit.

34. The imaging system of claim 27, further comprising sequentially reading out alternating pixels of the detector, wherein scanning said at least one object is performed linearly.

35. The imaging system of claim 27, wherein said at least one signal is at least one count signal used to produce said at least one image.

36. The imaging system of claim 35, wherein said at least one processing system produces at least two images using said at least one count signal for different energy ranges.

37. The imaging system of claim 27, wherein TDI technique is used.

38. The imaging system of claim 27, wherein said at least one integrated circuit is disposed under said at least one position sensitive direct conversion detector.

39. The imaging system of claim 38, wherein at least one mounting board is disposed in between said at least one integrated circuit and said at least one position sensitive direct conversion detector.

40. An imaging system comprising in combination:
   at least one source of radiation;
   at least one four-side abuttable position sensitive direct conversion detector system, wherein said at least one four-side abuttable position sensitive direct conversion detector system produces at least one charge signal from at least one portion of radiation emitted from said at least one source of radiation and wherein said at least one source of radiation directed to said at least one four-side abuttable position sensitive direct conversion detector system;
   at least one integrated circuit disposed under said at least one four-side abuttable position sensitive direct conversion detector system, wherein said at least one integrated circuit produces at least one signal from said at least one charge signal and wherein said at least one integrated circuit is a mixed signal integrated circuit having at least one analog circuit and at least one digital circuit;
   at least one object placed between said at least one source of radiation and said at least one four-side abuttable position sensitive direct conversion detector system;
   at least one processing system responsive to said at least one signal; and
   said at least one processing system that processes said at least one signal to produce at least one image of at least one portion of said at least one object, wherein said at least one processing system produces at least two images each one for a different energy range.

41. The imaging system of claim 40, wherein said at least one position sensitive direct conversion detector has a plurality of pixels.

42. The imaging system of claim 41, wherein said at least one signal is transferred from pixel to pixel within said plurality of pixels.

43. The imaging system of claim 42, wherein said at least one charge signal is accumulated across at least one column of pixels.

44. The imaging system of claim 40, wherein said at least one portion of radiation emitted from said at least one source of radiation is selected from the group consisting of positrons, electrons and photons.

45. The imaging system of claim 40, wherein said at least one four-side abuttable position sensitive direct conversion detector is comprises at least two four-side abuttable position sensitive direct conversation detectors positioned to abut one another.

46. The imaging system of claim 40, wherein said at least one charge signal is accumulated over a plurality sections of said at least one four-side abuttable position sensitive direct conversion detector using said at least one integrated circuit and output at multiple points across said at least one position sensitive direct conversion detector using said at least one integrated circuit.

47. The imaging system of claim 40, wherein said at least one image consists of plurality of images wherein each image correspond to different depths within said at least one object.

48. The imaging system of claim 40, wherein said at least one processing system produces at least two images each one for a different energy range.

49. The imaging system of claim 40, wherein said at least one signal is used to produce at least two images, wherein each image is for a different energy range.

50. The imaging system of claim 49, wherein said at least one processing system produces at least one image for said at least one energy range using said at least one count signal.

51. The imaging system of claim 40, wherein TDI technique is used.

52. The imaging system of claim 40, wherein at least one mounting board is disposed in between said at least one integrated circuit and said at least one position sensitive direct conversion detector.

53. A method for producing a plurality of images, comprising the steps of:
 using at least one source of radiation;
 constructing at least one position sensitive direct conversion detector;
 producing at least one charge signal from at least one portion of radiation emitted from said at least one source of radiation in said at least one position sensitive direct conversion detector;
 coupling at least one integrated circuit to said at least one position sensitive direct conversion detector, wherein said at least one integrated circuit produces at least one signal from said at least one charge signal;
 partitioning at least one portion of said at least one signal into at least two energy ranges;
 directing said at least one source of radiation to at least one portion of said at least one position sensitive direct conversion detector;
 placing at least one portion of at least one object between said at least one source of radiation and said at least one position sensitive direct conversion detector;
 imaging at least one portion of said at least one object by said at least one position sensitive direct conversion detector; and
 producing a plurality of images simultaneously of said at least one portion of said at least one object, wherein at least two of said plurality of images corresponds to said at least two energy ranges.

54. The method of claim 53, wherein said at least one position sensitive direct conversion detector has a plurality of pixels.

55. The method of claim 53, wherein said radiation is selected from the group consisting of positrons, electrons and photons.

56. An imaging system comprising in combination:
 at least one source of radiation;
 at least one position sensitive direct conversion detector, wherein said at least one position sensitive direct conversion detector produces at least one charge signal from at least one portion of radiation emitted from said at least one source of radiation and wherein said at least one source of radiation is directed to at least one portion of said at least one position sensitive direct conversion detector;
 at least one integrated circuit coupled to said at least one position sensitive direct conversion detector, wherein said at least one integrated circuit produces at least one signal from said at least one charge signal,
 wherein at least one portion of said at least one signal is partitioned into at least two energy ranges;
 at least one portion of at least one object placed between said at least one source of radiation and said at least one position sensitive direct conversion detector, wherein said at least one position sensitive direct conversion detector images said at least one portion of said object; and
 at least one processing system that processes said at least one signal partitioned into said at least two energy ranges to produce simultaneously at least two images for said at least one portion of said at least one object, wherein each of said at least two images corresponds to said at least two energy ranges.

57. The imaging system of claim 56, wherein said at least one position sensitive direct conversion detector has a plurality of pixels.

58. The imaging system of claim 56, wherein said radiation is selected from the group consisting of positrons, electrons and photons.

* * * * *